(12) United States Patent
Fujiki et al.

(10) Patent No.: US 8,391,075 B2
(45) Date of Patent: Mar. 5, 2013

(54) NONVOLATILE SEMICONDUCTOR MEMORY DEVICE AND METHOD FOR DRIVING SAME

(75) Inventors: Jun Fujiki, Kanagawa-ken (JP); Naoki Yasuda, Kanagawa-ken (JP); Koichi Muraoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/239,964

(22) Filed: Sep. 22, 2011

(65) Prior Publication Data

US 2012/0069679 A1 Mar. 22, 2012

Related U.S. Application Data

(63) Continuation of application No. PCT/JP2010/051995, filed on Feb. 10, 2010.

(30) Foreign Application Priority Data

Mar. 26, 2009 (JP) ................... 2009-77303

(51) Int. Cl.
*G11C 11/34* (2006.01)
*G11C 16/04* (2006.01)
*G11C 16/06* (2006.01)

(52) U.S. Cl. ......... 365/185.23; 365/185.17; 365/185.18; 365/185.21; 365/185.27

(58) Field of Classification Search ............ 365/185.17, 365/185.18, 185.21, 185.23, 185.27
See application file for complete search history.

(56) References Cited

U.S. PATENT DOCUMENTS 6,292,423 B1 9/2001 Iwahashi
6,567,312 B1 5/2003 Torii et al.
2001/0055223 A1 12/2001 Iwahashi
2003/0137877 A1 7/2003 Mokhlesi et al.
2009/0310425 A1* 12/2009 Sim et al. ................ 365/185.29
2012/0236652 A1* 9/2012 Okamoto ................ 365/185.18

FOREIGN PATENT DOCUMENTS

| JP | 2001-14868 | 1/2001 |
|---|---|---|
| JP | 2005-520270 | 7/2005 |
| JP | 2005-276428 | 10/2005 |
| JP | 2007-257827 | 10/2007 |
| JP | 2008-287831 | 11/2008 |
| WO | WO 03/063171 A2 | 7/2003 |

OTHER PUBLICATIONS

International Search Report mailed Apr. 27, 2010, in PCT/JP2010/051995 filed Feb. 10, 2010 (with English Translation).
International Written Opinion mailed mailed Apr. 27, 2010 in PCT/JP10/051995 filed Feb. 10, 2010.

* cited by examiner

*Primary Examiner* — Ly D Pham
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory string including a plurality of memory cells and, a driving unit. In sequentially reading data stored in the memory cells by applying a first signal to the memory cells, a second signal is applied to a second cell. The driving unit applies a third signal to the gate electrodes of all the memory cells prior to the sequential reading. The third signal has a voltage smaller than the second signal and time duration equal to or more than that of a sum of time duration during which the first signal is applied to all the memory cells. In a period prior to the third signal application, the driving unit performs at least one of applying a fourth signal to the gate electrodes and matching a potential of the gate electrodes with that of the semiconductor layer.

9 Claims, 17 Drawing Sheets

NONVOLATILE SEMICONDUCTOR MEMORY DEVICE AND METHOD FOR DRIVING SAME

CROSS-REFERENCE TO RELATED APPLICATIONS

This application is a continuation application of International Application PCT/JP2010/051995, filed on Feb. 10, 2010. This application also claims priority to Japanese Application No. 2009-077303, filed on Mar. 26, 2009. The entire contents of each are incorporated herein by reference.

FIELD

Embodiments described herein relate generally to a nonvolatile semiconductor memory device and a method for driving the same.

BACKGROUND

With demands for an increase in capacity, the downscaling of memory cell transistors becomes essential in NAND and NOR flash memories. The term "downscaling" means a reduction in the channel and width directions of the memory cell transistor. With this downscaling, it is necessary to reduce the thickness of the insulating film in order to maintain the controllability of the switching operation of the memory cell transistor.

A reduction in the thickness of the gate insulating film increases a leakage current one hand, and this causes a serious problem in the memory cell transistor. The flash memory is programmed by injecting charges into the floating electrode or charge storage layer sandwiched between insulating films, and it is more likely to lose programmed data if a leakage current increases. In the large capacity flash memory, high dielectric materials tend to be used for the insulating film applied to the memory cell transistor, particularly to the block insulating film. The high dielectric material has the effect to reduce the equivalent oxide thickness and decrease the leakage current.

However, the high dielectric material includes a polarization component thereinside. Polarization is generally categorized into instantaneous polarization and delay polarization. Instantaneous polarization is responsible for the dielectric constant of the high dielectric material. On the other hand, delay polarization states a polarization component that is slowly relaxed while applying an electric field to the insulating film made of the high dielectric material.

If an insulating film has this delay polarization, the dielectric constant of this insulating film changes with time depending on a time period for which an electric field is applied to this insulating film. When change with time occurs in the dielectric constant, the effective electric field applied to the channel is to change with time. The phenomenon that change with time occurs in the dielectric constant when applying an electric field to the insulating film is generally referred to as dielectric relaxation.

The flash memory is a device that identifies data based on whether a channel current is carried or not. In the case where such a high dielectric material, for example, is applied to a flash memory and this delay polarization is significant, the channel current changes with time during the read operation of the threshold, causing a difficulty in identifying data.

Methods of solving this problem have not been disclosed yet.

For one of driving methods of reading data that is programmed in a memory cell, pre-charge is proposed (for example, see JP-A 2008-287831 (Kokai)).

For a driving method of programming data in a memory cell, a method of using step voltage is proposed (for example, see JP-A 2005-276428 (Kokai)).

DETAILED DESCRIPTION

Figure 1:
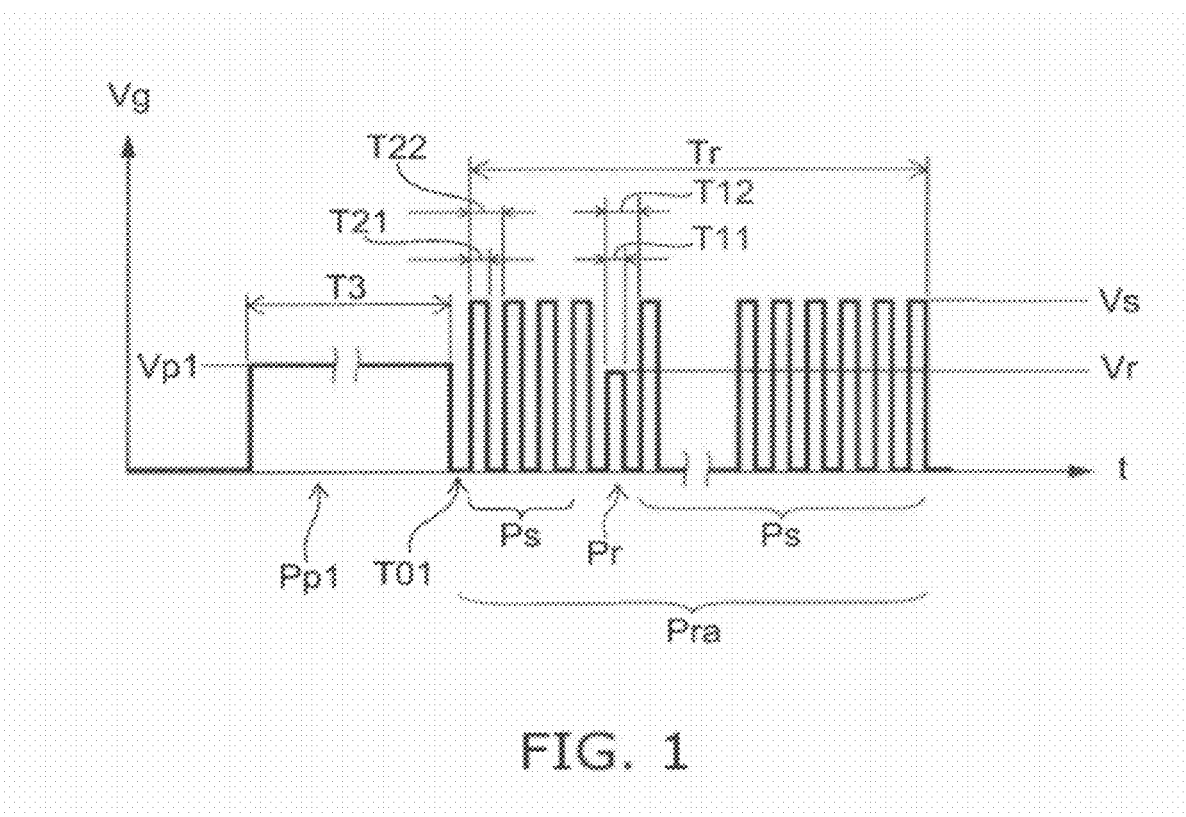
FIG. 1 is a schematic view illustrating the operation of a nonvolatile semiconductor memory device according to a first embodiment.

In general, according to one embodiment, a nonvolatile semiconductor memory device includes a memory string and a driving unit. The memory string has a plurality of memory cells. The driving unit is connected to the memory cells. Each memory cell includes: a semiconductor layer having a source region, a drain region and a channel provided between the source region and the drain region; a first insulating film provided on the channel; a charge retention layer provided on the first insulating film; and a gate electrode provided on the charge retention layer. In sequentially reading data stored in the memory cells by sequentially applying a first signal to each memory cell, a second signal is applied to a second cell when applying the first signal to a first cell. The first cell is one of the memory cells. The second cell is the memory cell of the memory cells except the first cell. The driving unit is configured to apply a third signal to the gate electrodes of all the memory cells included in the memory string prior to the sequential reading. The third signal has a third signal voltage and a third signal time duration. An absolute value of the third signal voltage is smaller than an absolute value of a voltage of the second signal. The third signal time duration is equal to or more than a sum of time duration during which the first signal is sequentially applied to all the memory cells included in the memory string in the sequential reading. In a period prior to the application of the third signal, the driving unit is configured to perform at least one of applying a fourth signal to the gate electrodes of all the memory cells included in the memory string, and matching a potential of the gate electrodes of all the memory cells included in the memory string with a potential of the semiconductor layer.

According to another embodiment, a nonvolatile semiconductor memory device includes a memory string and a driving unit. The memory string has a plurality of memory cells. The driving unit is connected to the memory cells. Each memory cell includes: a semiconductor layer having a source region, a drain region and a channel provided between the source region and the drain region; a first insulating film provided on the channel; a charge retention layer provided on the first insulating film; and a gate electrode provided on the charge retention layer. In sequentially reading data stored in the memory cells by sequentially applying a first signal to each memory cell, a second signal is applied to a second cell when applying the first signal to a first cell. The first cell is one of the memory cells. The second cell is the memory cell of the memory cells except the first cell. Prior to application of a fifth signal and a sixth signal, the driving unit is configured to apply a seventh signal to the gate electrode of a third cell. The fifth signal programs data in the third cell. The sixth signal verify-reads the programmed data. The third cell is at least one of the memory cells in the memory string. The seventh signal has a seventh signal voltage and a seventh signal time duration. An absolute value of the seventh signal voltage is smaller than an absolute value of a voltage of the fifth signal. The seventh signal time duration is equal to or more than a time duration during which the fifth signal and the sixth signal are applied to the third cell.

According to another embodiment, a method is disclosed for driving a nonvolatile semiconductor memory device. The nonvolatile semiconductor memory device includes: a memory string having a plurality of memory cells; and a driving unit connected to the memory cells. Each memory cell includes: a semiconductor layer having a source region, a drain region and a channel provided between the source region and the drain region; a first insulating film provided on the channel; a charge retention layer provided on the first insulating film; and a gate electrode provided on the charge retention layer. In sequentially reading data stored in the memory cells by sequentially applying a first signal to each memory cell, a second signal being applied to a second cell when applying the first signal to a first cell. The first cell is one of the memory cells. The second cell is the memory cell of the memory cells except the first cell. The method includes: prior to the sequential reading, applying a third signal to the gate electrodes of all the memory cells included in the memory string. The method further includes in a period prior to the application of the third signal, performing at least one of: applying a fourth signal to the gate electrodes of all the memory cells included in the memory string; and matching a potential of the gate electrodes of all the memory cells included in the memory string with a potential of the semiconductor layer. The third signal has a third signal voltage and a third signal time duration. An absolute value of the third signal voltage is smaller than an absolute value of a voltage of the second signal. The third signal time duration is equal to or more than a time duration during which the first signal is applied to all the memory cells included in the memory string in sequential reading.

According to another embodiment, a method is disclosed for driving a nonvolatile semiconductor memory device. The nonvolatile semiconductor memory device includes: a memory string having a plurality of memory cells; and a driving unit connected to the memory cells. Each memory cell includes: a semiconductor layer having a source region, a drain region and a channel provided between the source region and the drain region; a first insulating film provided on the channel; a charge retention layer provided on the first insulating film; and a gate electrode provided on the charge retention layer. In sequentially reading data stored in the memory cells by sequentially applying a first signal to each memory cell, a second signal being applied to a second cell when applying the first signal to a first cell. The first cell is one of the memory cells. The second cell is the memory cell of the memory cells except the first cell. The method includes prior to application of a fifth signal and a sixth signal, applying a seventh signal to the gate electrode of a third cell. The fifth signal programs data in the third cell. The sixth signal verify-reads the programmed data. The third cell is at least one of the memory cells in the memory string. The seventh signal has a seventh signal voltage and a seventh signal time duration. An absolute value of the seventh signal voltage is smaller than an absolute value of a voltage of the fifth signal. The seventh signal time duration is equal to or more than a time duration during which the fifth signal and the sixth signal are applied to the third cell.

Various embodiments will be described hereinafter with reference to the accompanying drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification and drawings of the application, components similar to those described or illustrated in a drawing thereinabove are marked with like reference numerals, and a detailed description is omitted as appropriate.

A nonvolatile semiconductor memory device and a method for driving the same according to embodiments will be described as an N-channel transistor cell is taken as an example. The embodiments are also applicable to a P-channel transistor cell, not only to the N-channel transistor cell. At that time, by reversing the polarity of the source and drain region and the impurity of the semiconductor layer described below and exchanging the voltages applied to the semiconductor substrate and the gate electrode, the following explanation can be applicable.

First Embodiment

FIG. 1 is a schematic view illustrating the operation of a nonvolatile semiconductor memory device according to a first embodiment.

Figure 2A:
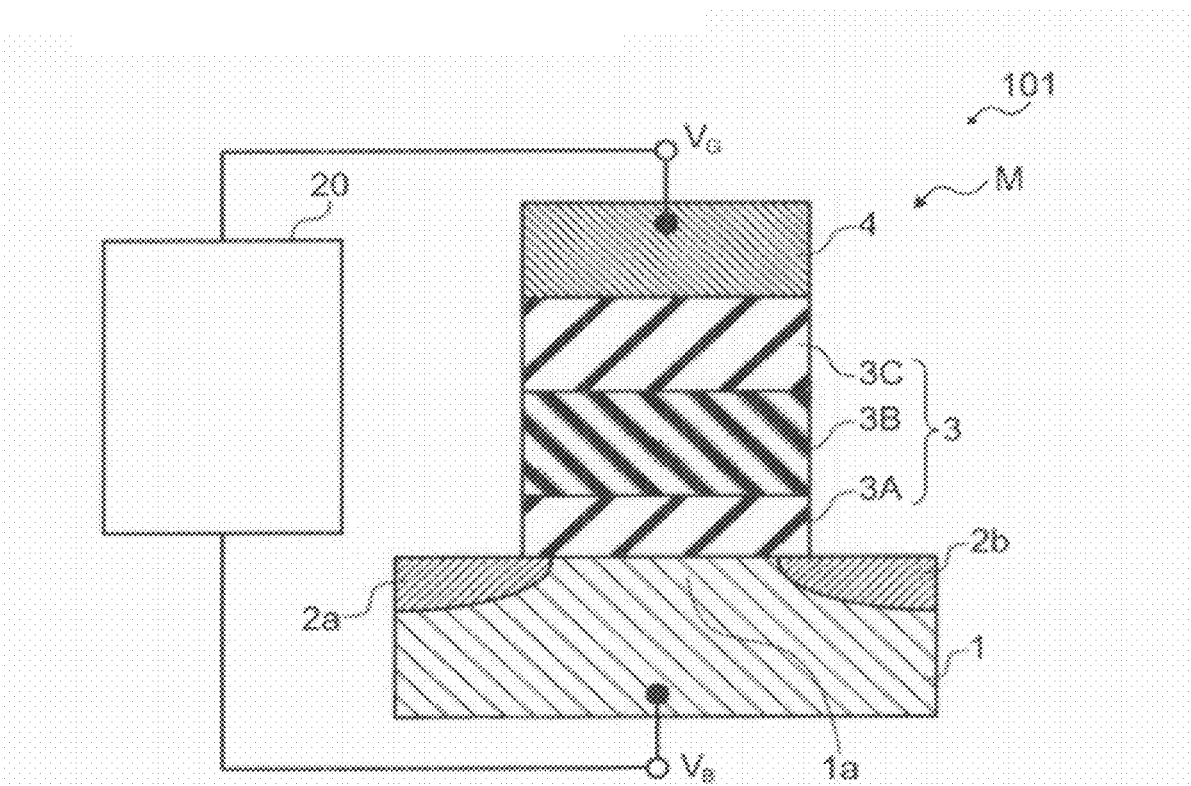
FIG. 2A and FIG. 2B are schematic cross-sectional views illustrating the configuration of the nonvolatile semiconductor memory device according to the first embodiment.
Figure 2B:
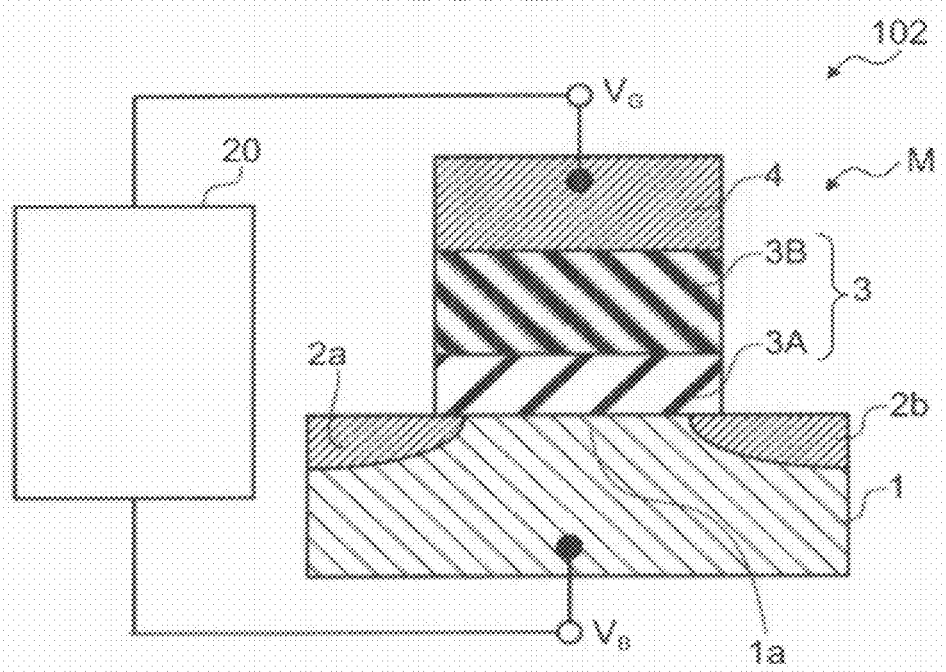

FIG. 2A and FIG. 2B are schematic cross-sectional views illustrating the configuration of the nonvolatile semiconductor memory device according to the first embodiment.

Figure 3:
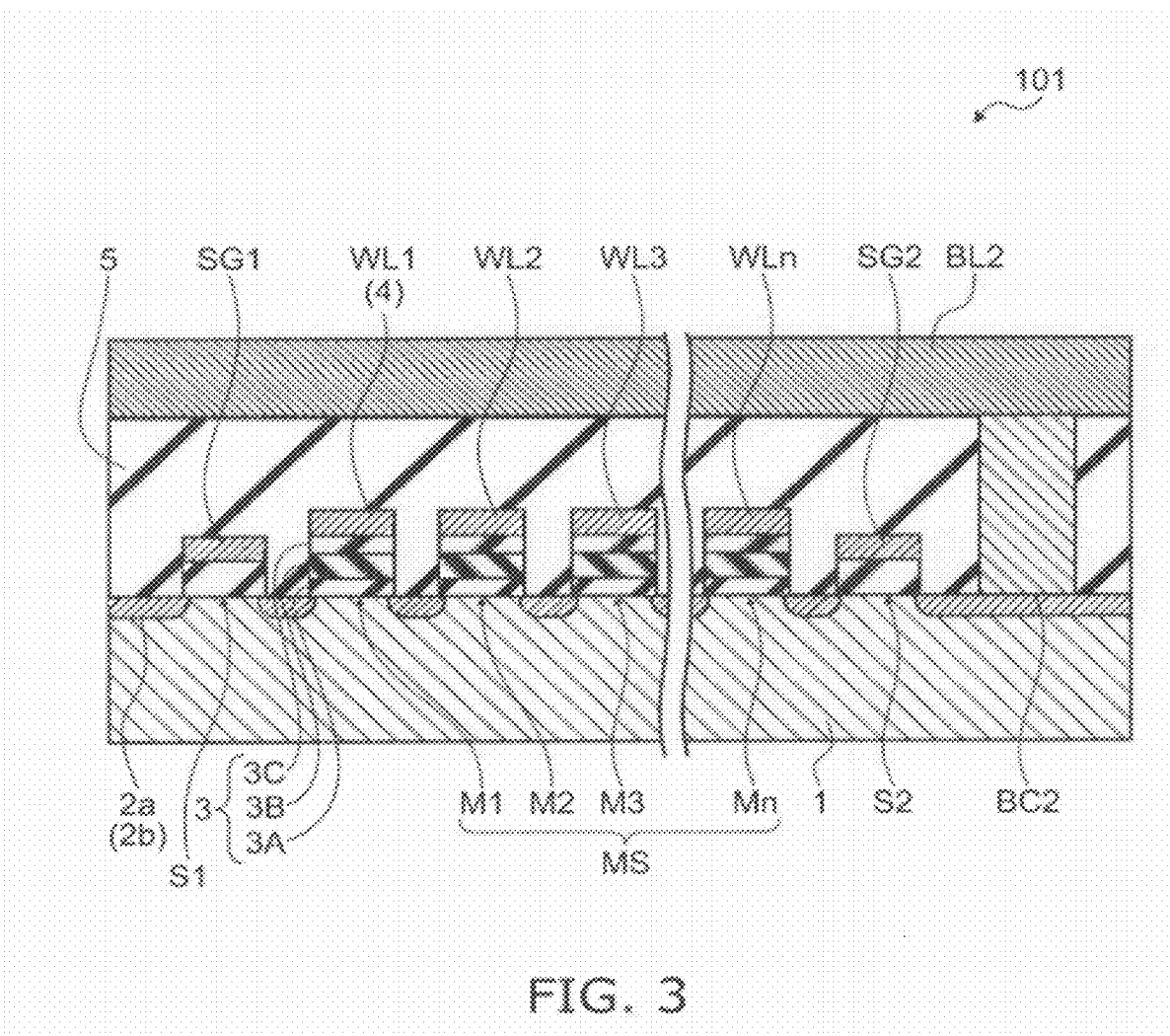
FIG. 3 is a schematic cross-sectional view illustrating the structure of a memory string in the nonvolatile semiconductor memory device according to the first embodiment.

FIG. 3 is a schematic cross-sectional view illustrating the structure of a memory string in the nonvolatile semiconductor memory device according to the first embodiment.

Figure 4:
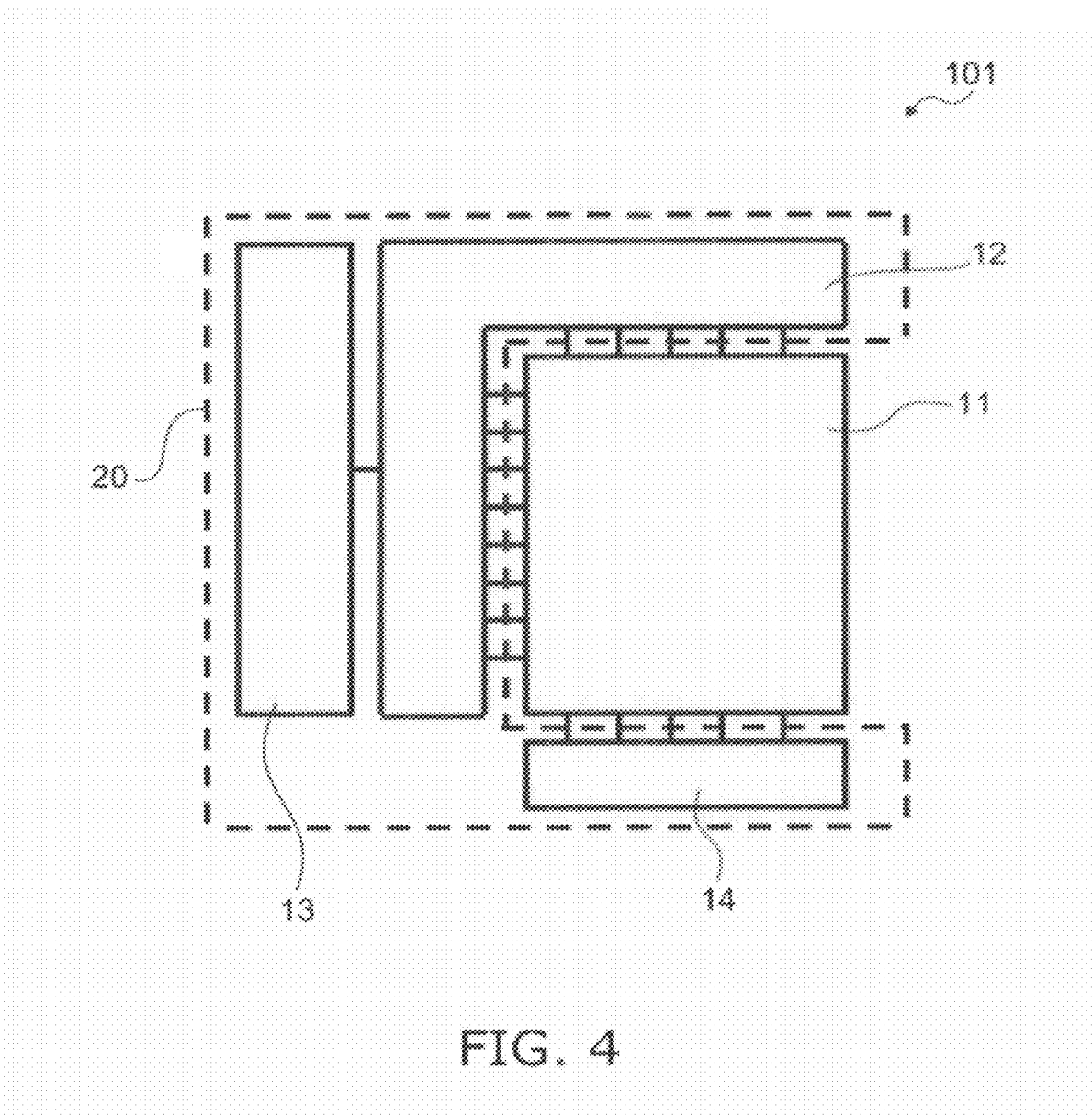
FIG. 4 is a schematic plan view illustrating the configuration of the nonvolatile semiconductor memory device according to the first embodiment.

FIG. 4 is a schematic plan view illustrating the configuration of the nonvolatile semiconductor memory device according to the first embodiment.

First, an exemplary configuration of a single memory cell in the nonvolatile semiconductor memory device according to this embodiment will be described with reference to FIG. 2A and FIG. 2B.

As illustrated in FIG. 2A, a nonvolatile semiconductor memory device 101 according to this embodiment is provided with a semiconductor layer 1. The semiconductor layer 1 has a channel 1a, and a source region 2a and a drain region 2b that are provided on both sides of the channel 1a. It is possible to exchange the source region 2a and the drain region 2b with each other.

There are further provided a first insulating film 3A provided on the channel 1a, a charge retention layer 3B provided on the first insulating film 3A, a second insulating film 3C provided on the charge retention layer 3B, and a gate electrode 4 provided on the second insulating film 3C.

The semiconductor layer 1 including the channel 1a, the source region 2a, and the drain region 2b; the first insulating film 3A; the charge retention layer 3B; the second insulating film 3C; and the gate electrode 4 forms a single memory cell M.

A driving unit 20 is provided to connect to this memory cell. More specifically, the driving unit 20 is connected to the semiconductor layer 1 and the gate electrode 4, and can form a potential difference between the semiconductor layer 1 and the gate electrode 4. The potential of the semiconductor layer 1 is a back bias voltage $V_B$, and the potential of the gate electrode 4 is a gate voltage $V_G$. In the following, the gate voltage when the back bias voltage $V_B$ is taken as a reference is referred to be the gate voltage $V_G$.

In the nonvolatile semiconductor memory device 101, a floating electrode, a charge storage layer, a floating dot layer, or the like can be applied to the charge retention layer 3 because the first and second insulating films 3A and 3C are provided below and above the charge retention layer 3B.

The charge storage layer is an insulating film that has a function to trap injected electric charges. The charge storage layer has discrete traps, for example. Discrete traps can be spatially distributed, which are distributed in the charge storage layer at least one of places near the interface on the semiconductor layer 1 side (i.e. the first insulating film 3A side) of the charge storage layer and near the interface on the gate electrode 4 side (i.e. the second insulating film 3C side) of the charge storage layer. It is possible to use a silicon nitride film, for example, for the charge storage layer, and it is also possible to use a metal oxide film or the like with discrete traps at high density. Moreover, it is also possible to form the charge storage layer by stacking a plurality of materials with discrete traps. Furthermore, to the charge storage layer, it is also possible to apply an insulating layer with no discrete traps in the charge storage layer. The charge storage layer has a function to release trapped electric charges.

In addition to the aforementioned silicon nitride, for example, the following can be used for the charge storage layer: silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride aluminate (HfAlON), hafnium silicate (HfSiO), hafnium nitride silicate (HfSiON), lanthanum oxide ($La_2O_3$), lanthanum aluminate ($LaAlO_3$), or the like.

For an example that uses a stacked structure for the charge storage layer, a variety of stacked structures can be applied to the charge storage layer, including NA, NH, NL, NAN, NHN, NLN, NHA, NAL, and AHL (any of them can be stacked in arbitral order), where "N" represents silicon nitride, "A" represents aluminum oxide, "H" represents a material containing hafnium as a primary element, and "L" represents a material containing lanthanum as a primary element, for example.

On the other hand, in the case where the charge retention layer 3B is a floating electrode, a conductive material is used for the charge retention layer 3B.

It is possible to use a floating dot layer (nano-crystal layer) for the charge retention layer 3B. The term "floating dot layer" means a layer having a structure that semiconductor or metal particles (floating dots) are dispersed in an insulator matrix. The particle size ranges from 0.5 nm to 4 nm. For the floating dot layer, desirably, the size of the floating dot is small in order to accommodate a sufficient quantity of floating dots in a single memory cell M; desirably, the size ranges from 0.5 nm to 4 nm, more preferably, 0.5 nm to 2 nm.

To the floating electrode and the floating dot, it is possible to apply a semiconductor material such as silicon (Si), germanium (Ge), GaAs, InP, or the like, and a metal material such as Ti, Ta, Au, Al, Mo, or the like, for example.

Both of the floating electrode and the floating dot layer are not limited to have a single layer, and they may have a stacked structure of two layers, three layers, and so on, for example.

On the other hand, the first insulating film 3A electrically isolates the semiconductor layer 1 from the charge retention layer 3B, and the second insulating film 3C electrically isolates the gate electrode 4 from the charge retention layer 3B. More specifically, the first insulating film 3A and the second insulating film 3C have a function to confine the electric charges included in the charge retention layer 3B within the charge retention layer 3B during the retention of electric charges.

The first insulating film 3A and the second insulating film 3C have the effect to confine electric charges within the charge retention layer 3B, and the effect is greater as the first insulating film 3A and the second insulating film 3C have a higher potential barrier against the charge retention layer 3B.

It is possible to apply a high dielectric material to at least one of the first insulating film 3A and the second insulating film 3C.

It is possible to use the following, for example, for the first insulating film 3A and the second insulating film 3C: aluminum oxide ($Al_2O_3$), aluminum oxynitride (AlON), hafnia ($HfO_2$), hafnium aluminate ($HfAlO_3$), hafnia nitride (HfON), hafnium nitride aluminate (HfAlON), hafnium silicate (HfSiO), hafnium nitride silicate (HfSiON), lanthanum oxide ($La_2O_3$), lanthanum aluminate ($LaAlO_3$), or the like. These materials are materials with a high relative dielectric constant particularly, which are regarded as high dielectric materials. The high dielectric material is materials with a relative dielectric constant of seven or more, for example.

For the first insulating film 3A and the second insulating film 3C, it is possible to use a stacked film made of the aforementioned materials.

For the first insulating film 3A and the second insulating film 3C, it is also possible to use silicon oxide ($SiO_2$) or silicon oxynitride (SiON). However, the relative dielectric constant of these materials is lower than that of the aforementioned high dielectric materials, and the dielectric relaxation phenomenon is relatively small. Because of this, the effect exerted by the nonvolatile semiconductor memory device according to this embodiment and the driving method for the same is relatively smaller than in the case of using the aforementioned high dielectric materials. Thus, the nonvolatile semiconductor memory device according to this embodiment and the driving method described below are preferably applied to a nonvolatile semiconductor memory device and a driving method that the aforementioned high dielectric materials are used for at least one of the first insulating film 3A and the second insulating film 3C.

As illustrated in FIG. 2B, another nonvolatile semiconductor memory device 102 according to this embodiment has such a structure that the second insulating film 3C between the charge retention layer 3B and the gate electrode 4 in the nonvolatile semiconductor memory device 101 is omitted.

Because the second insulating film 3C is omitted in the nonvolatile semiconductor memory device 102, a conductive floating electrode is not used for the charge retention layer 3B, and the charge storage layer is preferably used for the charge retention layer 3B.

In the nonvolatile semiconductor memory devices 101 and 102, it is possible to form the source region 2a and the drain region 2b provided on both sides of the channel 1a in the semiconductor layer by selective ion implantation of an impurity reverse to the type of the semiconductor layer 1, for example, into the semiconductor layer 1 using the gate electrode 4 as a mask.

However, for the source region 2a and the drain region 2b, such a case can also be included that at least one of the source region 2a and the drain region 2b is formed for a channel that is spontaneously formed by capacitive coupling of the semiconductor layer 1 to the gate electrode 4 (for example, Chang-Hyun Lee, et al., VLSI Tech. Dig., pp. 118 to 119, 2008, and Hang-Ting Lue, et al., VLSL Tech. Dig., pp. 140 to 141, 2008). Also in this case, the nonvolatile semiconductor memory devices 101 and 102 are considered to have the source region 2a and the drain region 2b.

As recited above, the nonvolatile semiconductor memory devices 101 and 102 according to this embodiment include a transistor memory cell having the charge retention layer 3B.

The nonvolatile semiconductor memory device 101 is taken as an example concerning the first embodiment below. The similar operations are also performed in the nonvolatile semiconductor memory device 102 for obtaining the similar effect.

An explanation will be given as the nonvolatile semiconductor memory device 101 is an example of an N-channel memory cell in which a charge storage layer is used for the charge retention layer 3B.

In the case where the nonvolatile semiconductor memory device 101 has the N-channel memory cell M, the form of the semiconductor layer 1 includes a P-type well, P-type semiconductor layer, P-type polysilicon layer, or the like. For these layers, it is possible to use a silicon bulk substrate, SOI (Silicon On Insulator) layer, or the like.

In the nonvolatile semiconductor memory device 101, a plurality of memory cells M mentioned above are provided. For example, a memory cell array is provided in which the memory cells M are aligned in the column and row direction in a matrix. For example, a NAND memory string extending in the column direction is aligned in the row direction in multiple numbers to form the memory cell array.

FIG. 3 illustrates an exemplary structure of the NAND memory string in the column direction.

As illustrated in FIG. 3, a plurality of memory cells M are disposed on the semiconductor layer 1 to provide a memory string MS.

Here, suppose that the number of the memory cells M in the column direction is n, where n is an integer of two or more. The nth memory cell M is Mn. In other words, n memory cells, memory cells M1 to Mn, are provided in the column direction. The memory cells M1 to Mn are connected in the semiconductor layer 1.

Here, suppose that the direction vertical to the major surface of the semiconductor layer 1, i.e. the direction of stacking the first insulating film 3A, the charge retention layer 3B, the second insulating film 3C, and the gate electrode 4, is taken as a Z-axis direction. Suppose that the direction of aligning the memory cells M1 to Mn is taken as an X-axis direction. Suppose that the direction vertical to the Z-axis and X-axis direction is taken as a Y-axis direction. More specifically, in this specific example, the X-axis direction is the column direction, and the Y-axis direction is the row direction.

Here, each of the memory cells M1 to Mn has the configuration of a single memory cell M in the nonvolatile semiconductor memory device 101 already explained. However, they may have the configuration of that in the nonvolatile semiconductor memory device 102.

An interlayer insulating film 5 is provided on each of the memory cells M1 to Mn and therebetween, and the memory cells M1 to Mn are individually electrically isolated from each other. It is possible to use silicon dioxide, for example, for the interlayer insulating film 5.

Although not shown in FIG. 3, the memory string MS extending in the X-axis direction is provided in the Y-axis direction in multiple numbers in parallel with each other for forming a memory cell array.

The gate electrodes 4 of the memory cells M1 to Mn are word lines WL1 to WLn. These word lines WL1 to WLn connect the individual memory cells M1 to Mn of a plurality of memory strings MS to memory cells M1 to Mn of other memory strings MS aligned in the Y-axis direction.

Select transistors S1 and S2 are provided on both ends of the memory string MS. MOSFET, for example, is used for the select transistors S1 and S2. The gate electrodes of the select transistors S1 and S2 correspond to select gates SG1 and SG2, respectively.

A bit line BL1 is connected to one of the source region 2a and the drain region 2b close to the select transistor S1 through a bit line contact BC1. Similarly, a bit line BL2 is connected to one of the source region 2a and the drain region 2b close to the select transistor S2 through a bit line contact BC2. The bit line contact BC1 and the bit line BL1 are not shown in the drawing for avoiding complicatedness.

When the select transistors S1 and S2 are in the ON-state, the bit line BL1, the memory string MS, and the bit line BL2 are electrically connected and a voltage is sequentially applied to the word lines WL1 to WLn for programming data in the memory cells M1 to Mn, erasing data, or reading the programmed data, for example.

For example, in reading data, the state of a single memory cell Mi (i is an integer from one to less than n) in the memory string MS is transmitted to the bit line BL1 or bit line BL2 through the memory cells M1 to M(i−1) or the memory cells M(i+1) to Mn in the memory string MS. The state of the memory cell Mn is transmitted to the bit line BL1 or bit line BL2 by applying a voltage to the memory cells M1 to M(i+1).

For this, in the individual memory cells M1 to M(i−1) and the memory cells M(i+1) to Mn, the voltage that transmits data is applied to the word lines WL1 to WL(i−1) and the word lines WL(i+1) to WLn, which are the gate electrodes 4.

FIG. 4 illustrates the overall structure of the nonvolatile semiconductor memory device 101.

As illustrated in FIG. 4, the nonvolatile semiconductor memory device 101 has a memory cell array 11 (a plurality of memory strings) and the driving unit 20.

As already explained, in the memory cell array 11, the aforementioned memory string MS having the memory cells M aligned in the column direction, for example, is aligned in the row direction.

The driving unit 20 includes a voltage control circuit 12, a voltage generator 13, and a read circuit 14. The driving unit 20 forms a peripheral circuit that controls the operation of the memory cell array 11.

In the non-volatile semiconductor memory device 101 having this configuration, the following operation is performed in reading data stored in the memory cells M in the memory string MS.

FIG. 1 illustrates the operation in reading data in the nonvolatile semiconductor memory device 101.

The horizontal axis in FIG. 1 represents time t, and the vertical axis represents the gate voltage $V_G$. This specific example illustrates the case where i is five, that is, the gate voltage $V_G$ of the fifth memory cell M5 in the memory string MS is illustrated.

As illustrated in FIG. 1, in the memory string MS having the plurality of memory cells M, a read pulse Pr (a first signal) is applied to the memory cell M5 in the plurality of memory cells M, the read pulse Pr reading data stored in the memory cell M5 at certain timing (a first timing). At a second timing different from the first timing, a transmission pulse Ps (a second signal) that transmits data is applied to the memory cell M5.

Although not shown in the drawing, at the first timing, the transmission pulse Ps is applied to the memory cells except the memory cell M5, i.e. the memory cells M1 to M4 and M6 to Mn. At the second timing, the read pulse Pr is sequentially applied to the memory cells M1 to M4 and M6 to Mn other than the memory cell M5.

More specifically, the first timing is timing at which the read pulse Pr is applied to the memory cell M5 focused, and the second timing is timing at which the read pulse Pr is applied to the memory cells M1 to M4 and M6 to Mn.

The transmission pulse Ps is a pulse that transmits data in the memory cells M1 to M4 and M6 to Mn other than the memory cell M5 along the memory string, and the number of the transmission pulses Ps is (n−1) pulses in reading each one of memory cells M.

Here, the voltage of the read pulse Pr is a voltage Vr, and the width of the read pulse Pr is time duration T11, having a period (time) T12 from a point in time immediately after the application of the read pulse Pr to a point in time when the subsequent transmission pulse Ps is inputted.

On the other hand, the voltage of the transmission pulse Ps is a voltage Vs, and the width of the transmission pulse Ps is duration T21, having a period (time) T22 from a point in time immediately after the application of one transmission pulse Ps to a point in time when the subsequent transmission pulse Ps is inputted.

The voltage Vr of the read pulse Pr is generally set lower than the voltage Vs of the transmission pulse Ps.

As described above, (n−1) pulses of the transmission pulses Ps are applied to each of the individual memory cells M, in addition to the read pulse Pr which is applied to each of the individual memory cells M itself. The read pulse Pr and (n−1) pulses of the transmission pulses Ps are combined and referred to as a "read pulse group Pra."

Time duration Tr during which the read pulse Pr is applied to all the memory cells M included in the memory string MS is the same as the application time of the aforementioned read pulse group Pra.

As described above, in the nonvolatile semiconductor memory device 101, i.e. in the memory strings MS, in sequentially reading data stored in the plurality of memory cells M1 to Mn by sequentially applying the first signal (read pulse Pr) to each of the plurality of memory cells M1 to Mn, the second signal (transmission pulse Ps) that transmits the data is applied to second cells, i.e. the memory cells M1 to M(i−1) and M(i−1) to Mn, which are memory cells except the first cell from the plurality of memory cells M1 to Mn, when the first signal (read pulse Pr) is applied to a first cell (for example, the memory cell Mi), which is one of the plurality of memory cells M1 to Mn (the first timing).

More specifically, in reading data in the memory string MS, the transmission pulse Ps is applied to each of the individual memory cells M included in the memory string other than the timing at which data in each of the individual memory cells M itself is read (the timing at which the read pulse Pr is applied).

As illustrated in FIG. 1, in the nonvolatile semiconductor memory device 101, prior to the application of the read pulse group Pra, a first pre-pulse Pp1 (a third signal) is applied to all the memory cells M1 to Mn included in the memory string MS at the same time.

In this specific example, the first pre-pulse Pp1 is applied to the memory cells M1 to Mn at the same time. However, it may be possible to shift the application timing in some degree depending on the memory cells M1 to Mn if the first pre-pulse Pp1 is applied to the memory cells M1 to Mn prior to the application of the read pulse group Pra. It may be possible that the application time and voltage of the first pre-pulse Pp1 are varied depending on the memory cells M1 to Mn in some degree. More specifically, it is sufficient that the first pre-pulse Pp1 is applied to reduce differences in the history of the memory cells M1 to Mn before the timing of the read operation, and it may be possible that the application timing, time duration, and voltage value of the first pre-pulse Pp1 are varied depending on the memory cells M1 to Mn.

In the following, an explanation will be given where the first pre-pulse Pp1 is applied to the memory cells M1 to Mn at the same time and the application time and voltage of the first pre-pulse Pp1 are the same in the memory cells M1 to Mn.

The voltage of this first pre-pulse Pp1 is a voltage Vp1, and the width of the first pre-pulse Pp1 is time duration T3. In this specific example, an idle period T01 is provided between the first pre-pulse Pp1 and the read pulse group Pra. However, it may be possible that the idle period T01 is not provided and the voltage is directly changed from the voltage Vp1 of the first pre-pulse Pp1 to the voltage Vs of the transmission pulse Ps or to the voltage Vr of the read pulse Pr.

The voltage Vp1 of the first pre-pulse Pp1 is lower than the voltage Vs of the transmission pulse Ps. More specifically, the absolute value of the voltage Vp1 of the first pre-pulse Pp1 is smaller than the absolute value of the voltage Vs of the transmission pulse Ps.

The relationship between the voltage Vp1 of the first pre-pulse Pp1 and the voltage Vr of the read pulse Pr is arbitrarily.

This first pre-pulse Pp1 is applied to all the memory cells M1 to Mn, and then the read pulse group Pra is applied.

As described above, in the nonvolatile semiconductor memory device 101, the first pre-pulse Pp1 with the voltage Vp1, whose absolute value is smaller than the absolute value of the voltage Vs of the transmission pulse Ps, is applied to the gate electrodes 4 of all the memory cell M included in the memory string MS at the same time, and then the read pulse Pr is sequentially applied to the memory cells M1 to Mn included in the memory string MS for sequentially reading data stored in the memory cells M1 to Mn.

Thus, it is made possible to perform a stable read operation as explained below.

Figure 5A:
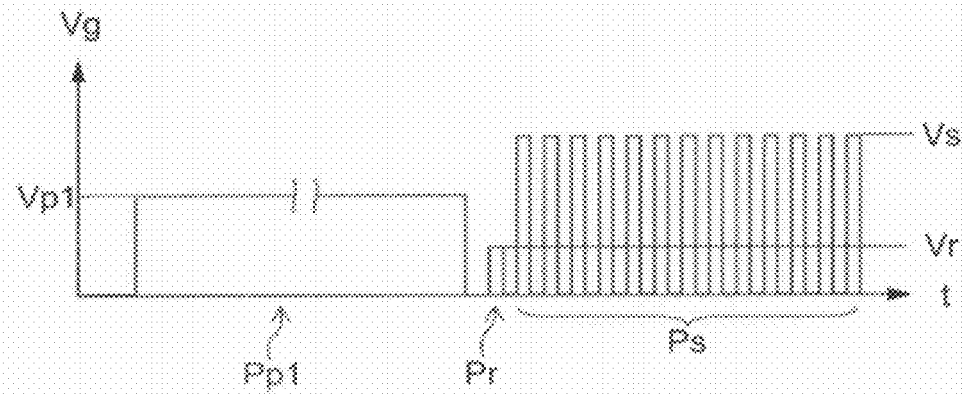
FIG. 5A, FIG. 5B, and FIG. 5C are schematic views illustrating the operation of the nonvolatile semiconductor memory device according to the first embodiment.
Figure 5B:
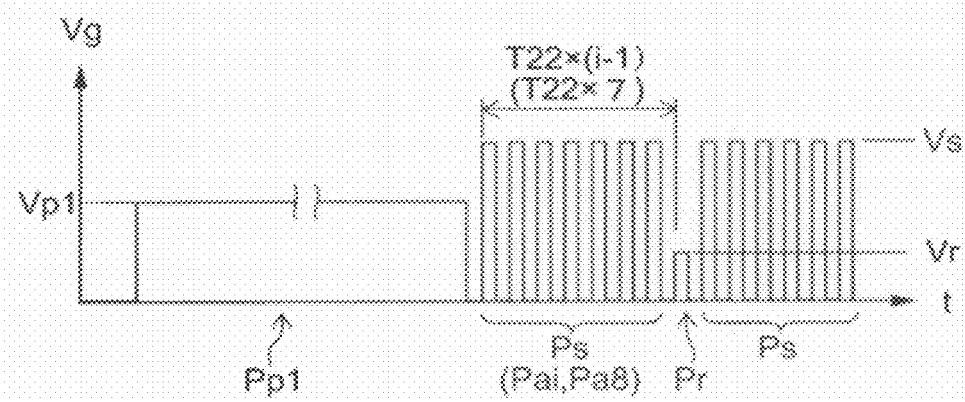
Figure 5C:
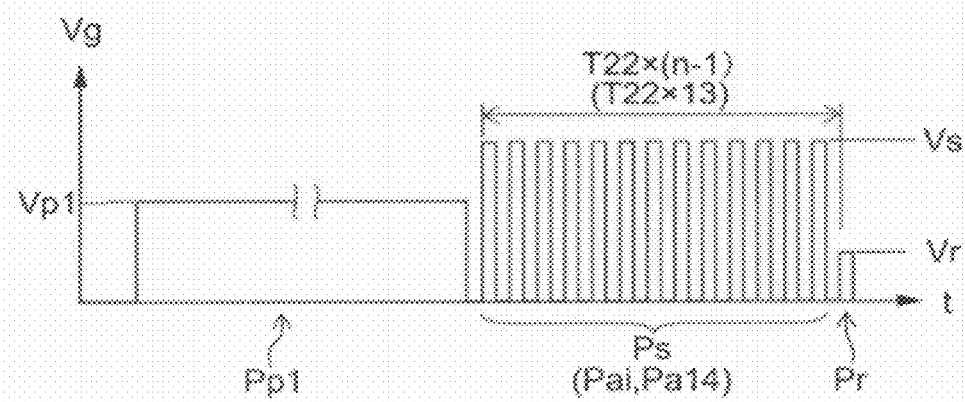

FIG. 5A, FIG. 5B, and FIG. 5C are schematic views illustrating the operation of the nonvolatile semiconductor memory device according to the first embodiment.

Figure 6A:
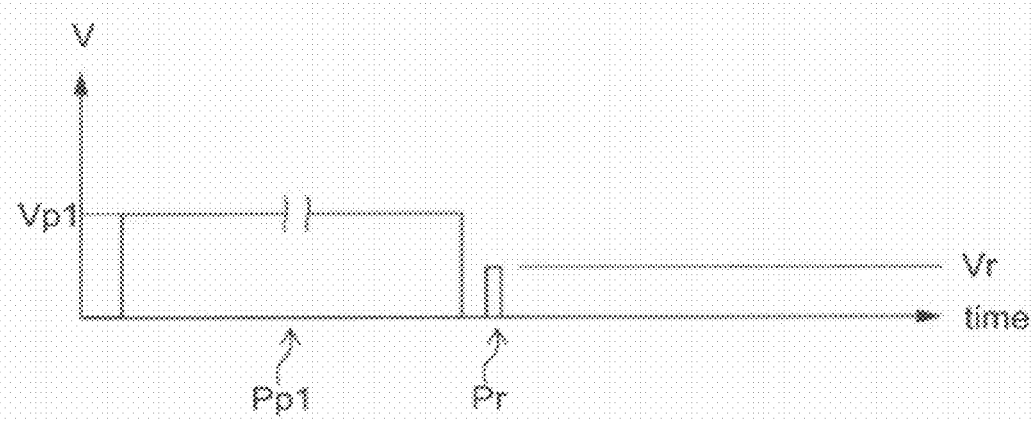
FIG. 6A, FIG. 6B, and FIG. 6C are other schematic views illustrating the operation of the nonvolatile semiconductor memory device according to the first embodiment.
Figure 6B:
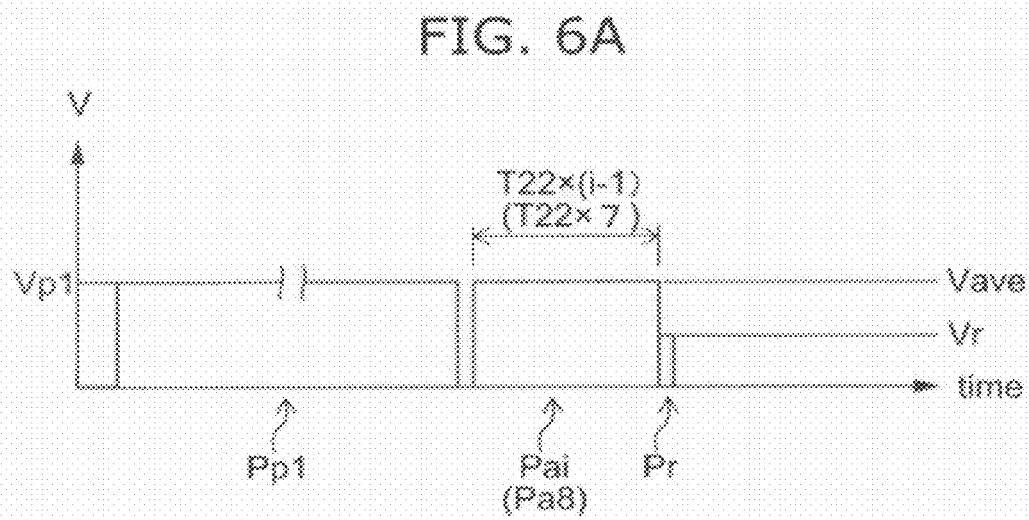
Figure 6C:
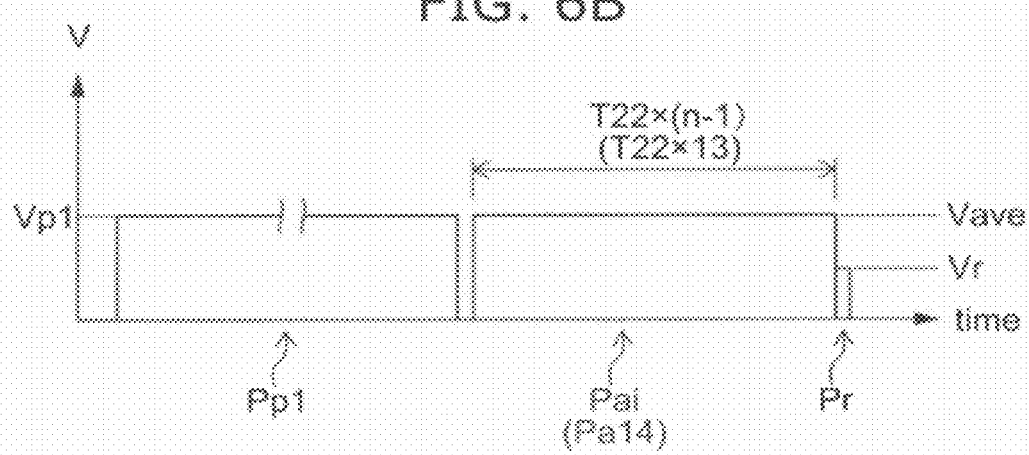

FIG. 6A, FIG. 6B, and FIG. 6C are other schematic views illustrating the operation of the nonvolatile semiconductor memory device according to the first embodiment.

In these drawings, an explanation will be given where the number of the memory cells M in the memory string MS is 14 for simplifying explanation. More specifically, the memory string MS includes memory cells M1 to M14.

FIG. 5A and FIG. 6A illustrate the gate voltage $V_G$ applied to the memory cell M1, FIG. 5B and FIG. 6B illustrate the gate voltage $V_G$ applied to the memory cell Mi, and FIG. 5C and FIG. 6C illustrate the gate voltage $V_G$ applied to the memory cell M14, where i=8, in this specific example.

FIG. 6A to FIG. 6C are drawings that simplify FIG. 5A to FIG. 5C, respectively.

As illustrated in FIG. 5A, to the first memory cell M1, the first pre-pulse Pp1 is first applied, and then the read pulse Pr is applied to read data in the memory cell M1. After that, 13 pulses of the transmission pulses Ps are applied for reading data in the other memory cells M2 to M14.

As illustrated in FIG. 5B, to the eighth memory cell M8, the first pre-pulse Pp1 is first applied, seven pulses of the transmission pulses Ps are applied for reading data in the memory cells M1 to M7, and then the read pulse Pr is applied for reading data in the memory cell M8. After that, six pulses of the transmission pulses Ps are applied for reading data in the other memory cells M9 to M14.

As illustrated in FIG. 5C, to the 14th memory cell M14, the first pre-pulse Pp1 is first applied, 13 pulses of the transmission pulses Ps are applied for reading data in the memory cells M1 to M13, and then the read pulse Pr is applied for reading data in the memory cell M14.

As described above, because the memory cells M have the string structure, the history prior to the application of the read pulse Pr is different in the memory cells M1, M8, and M14.

Here, in the memory cell Mi focused, the time (period) for applying the transmission pulse Ps in order to read data in the memory cells M1 to M(i−1) is T22×(i−1). An average voltage applied during the application of the transmission pulse Ps for reading data in the memory cells M1 to M(i−1) is referred to as an average voltage Vave.

More specifically, it is considered that during the period for reading data in the memory cells M1 to M(i−1), an averaging pulse Pai is applied to the memory cell Mi, whose voltage is the average voltage Vave and whose application time is T22×(i−1).

Here, in reading data in the individual memory cells M, it is likely that the history before the timing of the read operation causes fluctuations in the memory state. On the other hand, because data has already been read even though the memory state fluctuates after once data is read, attention is not paid to this. More specifically, attention is paid to the voltage applied prior to the application of the read pulse Pr to the individual memory cells M.

As illustrated in FIG. 6A, to the memory cell M1, the first pre-pulse Pp1 is applied prior to the application of the read pulse Pr.

As illustrated in FIG. 6B, to the memory cell M8, the first pre-pulse Pp1 and the averaging pulse Pa8 are applied prior to the application of the read pulse Pr. Here, the voltage of the averaging pulse Pa8 is the average voltage Vave, and the time duration is T22×7.

As illustrated in FIG. 6C, to the memory cell M14, the first pre-pulse Pp1 and the averaging pulse Pa14 are applied prior to the application of the read pulse Pr. The voltage of the averaging pulse Pa14 is the average voltage Vave, and the time duration is T22×13.

In the nonvolatile semiconductor memory device 101 according to this embodiment, it is possible to reduce a relative ratio between differences in the history prior to the application of the read pulse Pr to the individual memory cells M1 to Mn using the first pre-pulse Pp1.

COMPARATIVE EXAMPLE

Figure 7A:
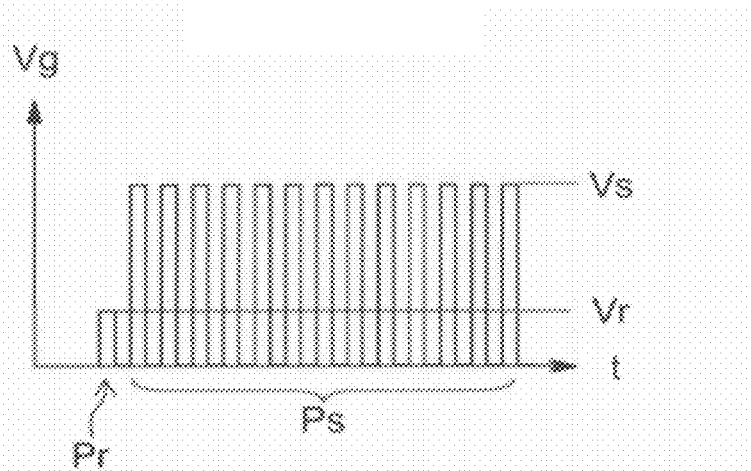
FIG. 7A, FIG. 7B, and FIG. 7C are schematic views illustrating the operation of a nonvolatile semiconductor memory device of a comparative example.
Figure 7B:
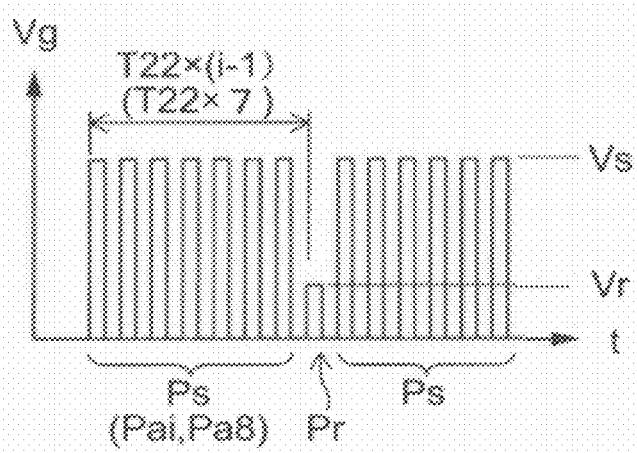
Figure 7C:
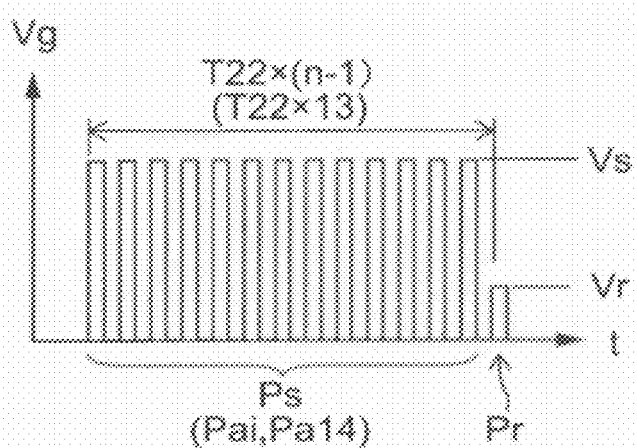

FIG. 7A, FIG. 7B, and FIG. 7C are schematic views illustrating the operation of a nonvolatile semiconductor memory device of a comparative example.

Figure 8A:
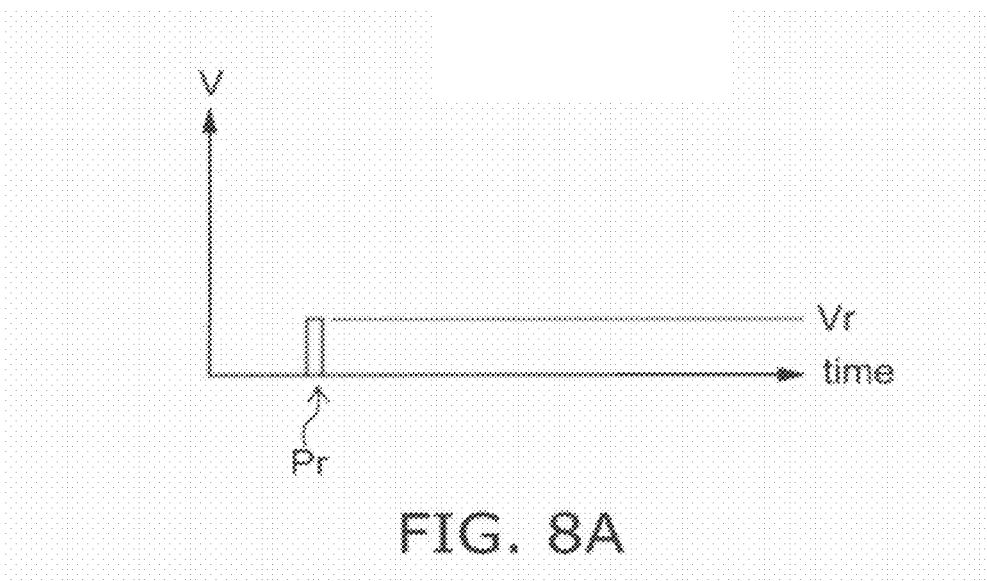
FIG. 8A, FIG. 8B, and FIG. 8C are other schematic views illustrating the operation of the nonvolatile semiconductor memory device of the comparative example.
Figure 8B:
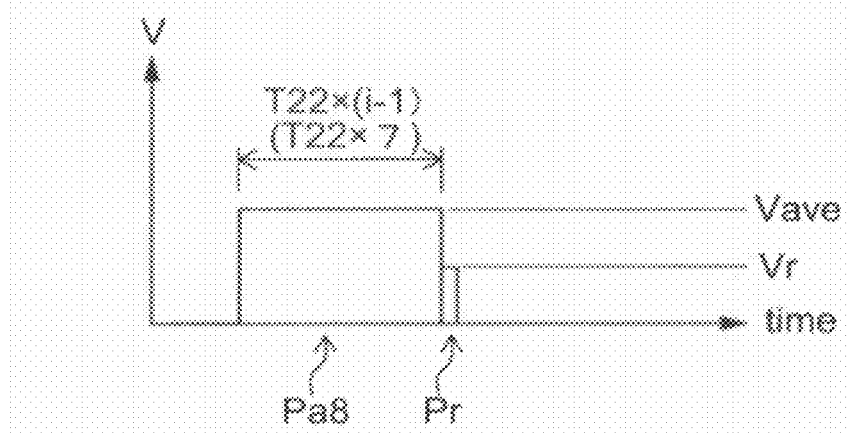
Figure 8C:
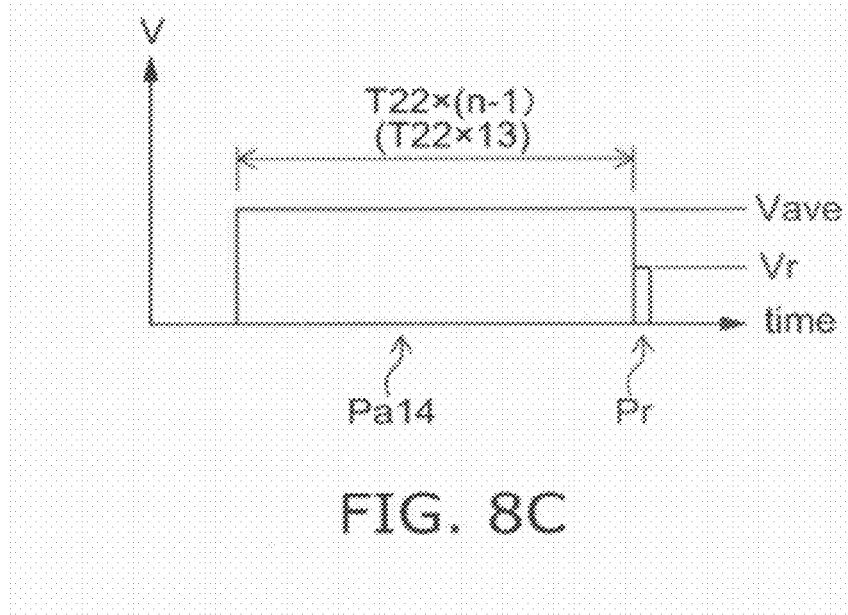

FIG. 8A, FIG. 8B, and FIG. 8C are other schematic views illustrating the operation of the nonvolatile semiconductor memory device of the comparative example.

The configuration of individual memory cells M of the nonvolatile semiconductor memory device of the comparative example is the same as the configuration of the memory cells M of the nonvolatile semiconductor memory device 101 according to this embodiment. However, as illustrated in FIG. 7A, FIG. 7B, FIG. 7C, FIG. 8A, FIG. 8B, and FIG. 8C, the operation of a driving unit 20 is different, and the first pre-pulse Pp1 is not applied. These drawings also illustrate the case where the number of the memory cells M in the memory string MS is 14.

As illustrated in FIG. 7A, to the memory cell M1, the read pulse Pr is applied, and then 13 pulses of the transmission pulses Ps are applied. As illustrated in FIG. 7B, to the memory cell M8, seven pulses of the transmission pulses Ps are applied, the read pulse Pr is applied, and then six pulses of the transmission pulses Ps are applied. As illustrated in FIG. 7C, to the memory cell M14, 13 pulses of the transmission pulses Ps are applied, and then the read pulse Pr is applied.

More specifically, as illustrated in FIG. 8A, to the memory cell M1, the other voltages are not applied prior to the application of the read pulse Pr. As illustrated in FIG. 8B, to the memory cell M8, the averaging pulse Pa8 (at the average voltage Vave for the time duration of T22×7) is applied prior to the application of the read pulse Pr. As illustrated in FIG. 8C, to the memory cell M14, the averaging pulse Pa14 (at the average voltage Vave for the time duration of T22×13) is applied prior to the application of the read pulse Pr.

As described above, in the nonvolatile semiconductor memory device of the comparative example, the ratio between differences in the history prior to the application of the read pulse Pr to the individual memory cells M1 to Mn is significantly large. More specifically, the history is changed from the state in which the voltage is not applied to the memory cell M1 to the averaging pulse Pa14 to the memory cell M14. For example, also in the case based on the memory cell M2, the application time of the averaging pulse Pai applied prior to the application of the read pulse Pr changes from T22×1 to T 22×13, and the ratio is 13 times, i.e. (n−1) times.

On the contrary, as already explained, in the nonvolatile semiconductor memory device 101 according to this embodiment, the first pre-pulse Pp1 is applied to all the memory cells M1 to Mn at the same time, and then the read pulse Pr is sequentially applied. The voltage applied prior to the application of the read pulse Pr to the memory cells M1 to M14 varies from the first pre-pulse Pp1 in the memory cell M1 to the sum of the first pre-pulse Pp1 and the averaging pulse Pa14 in the memory cell M14. Thereby, the ratio of the change is smaller than that of the comparative example.

More particularly, it is possible to reduce the ratio of the history before reading data in the memory cells M1 to Mn by prolonging the application time of the first pre-pulse Pp1.

As described above, in the nonvolatile semiconductor memory device 101 according to this embodiment, it is possible to reduce differences in the history prior to the application of the read pulse Pr to the individual memory cells M1 to Mn using the first pre-pulse Pp1, and thus it is made possible to perform a stable read operation.

First Experiment

In the following, experimental results will be described, which were studied on the influence of the voltage application history on read data prior to the application of the read pulse Pr in the nonvolatile semiconductor memory device.

In this experiment, the memory cell M having the configuration illustrated in FIG. 2A was used. In the memory cell M, S1 is used for the semiconductor layer 1, $SiO_2$ having a thickness of 4 nm (nanometer) is used for the first insulating film 3A, SiN having a thickness of 5 nm is used for the charge retention layer 3B, AlO having a thickness of 15 nm is used for the second insulating film 3C, and TaN is used for the gate electrode 4. As described above, the memory cell M is a charge trapping transistor having an insulating material with a high dielectric constant. The channel length of this transistor is 0.4 μm (micrometer), and the channel width is 6 μm.

Figure 9:
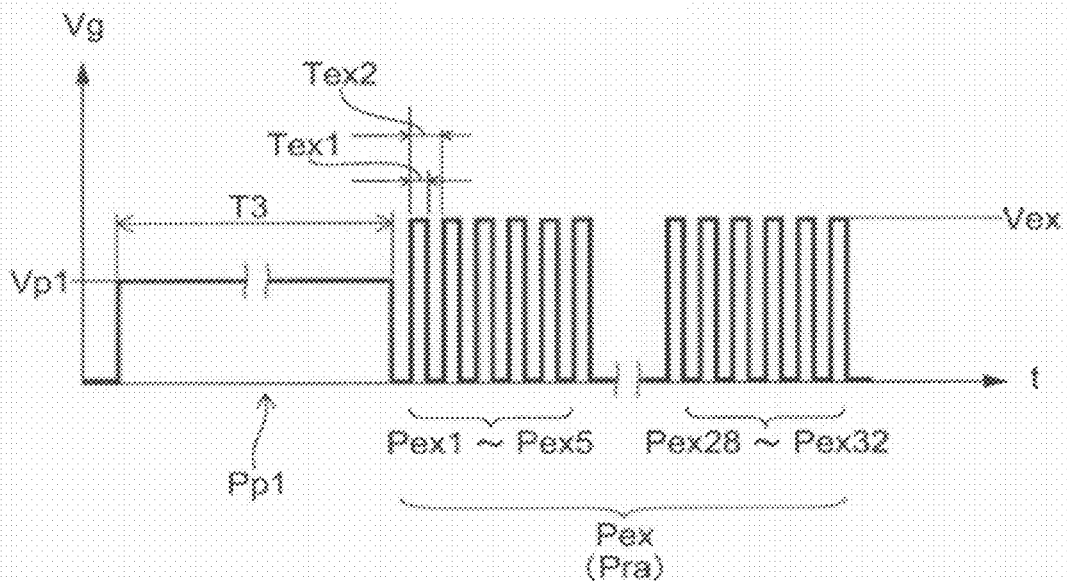
FIG. 9 is a schematic view illustrating waveforms used for the characteristic evaluation experiment of the nonvolatile semiconductor memory device according to the first embodiment.

FIG. 9 is a schematic view illustrating waveforms used for the characteristic evaluation experiment of the nonvolatile semiconductor memory device according to the first embodiment.

As illustrated in FIG. 9, in this experiment, the read pulse Pr and the transmission pulse Ps were not distinguished from each other for simplicity, and an experimental pulse Pex corresponding to these pulses was used. More specifically, although a voltage Vex of the experimental pulse Pex corresponds to the voltage Vs or voltage Vr, it is a constant voltage because the read pulse Pr and the transmission pulse Ps are not distinguished from each other. The voltage Vex was set to 6 V. Time duration Tex1 of the experimental pulse Pex corresponds to the time duration T11 of the read pulse Pr and the time duration T21 of the transmission pulse Ps, and the time duration Tex1 was set to 15 μs (microsecond). A period (time) Tex2 of the experimental pulse Pex corresponds to the period (time) T12 of the read pulse Pr and the period (time) T22 of the transmission pulse Ps, and the period (time) Tex2 was set to 30 μs.

The characteristics of the memory cell M were evaluated where the time duration T3 of the first pre-pulse Pp1 was set constant to 10 ms (millisecond), and the voltage Vp1 of the first pre-pulse Pp1 was varied.

At that time, the case was thought where the number n of the memory cells M in the memory string MS was 32. Thus, 32 pulses of the experimental pulses Pex are applied, which correspond to the total of the read pulse Pr and 31 pulses of the transmission pulses Ps, i.e. the read pulse group Pra. The application time for 32 pulses of the experimental pulses Pex is 960 μs. The time duration T3 of the first pre-pulse Pp1 is about 10 times the application time of the total of the read pulse Pr and 31 pulses of the transmission pulses Ps.

In this experiment, instead of actually preparing a memory string having 32 cells of the memory cells M aligned and evaluating that, for a single memory cell M, the waveforms used for evaluation were varied. Thereby, the voltage application states in memory cells in an arbitral order were reproduced, and the characteristics of the memory cells in an arbitral order were evaluated.

A channel current difference (a channel current fluctuation ΔIch) was evaluated, which corresponded to the memory cells in a different order.

More specifically, a difference between the channel currents of the memory cells M read with experimental pulses Pex1 to Pex5 (where i=1 to 5), which corresponded to first five memory cells (where i=1 to 5) in the memory string MS, was taken as a channel current fluctuation ΔIch1. A difference between the channel currents of the memory cells M read with experimental pulses Pex28 to Pex32 (where i=28 to 32), which corresponded to last five memory cells (where i=28 to 32), was taken as a channel current fluctuation ΔIch2.

Figure 10:
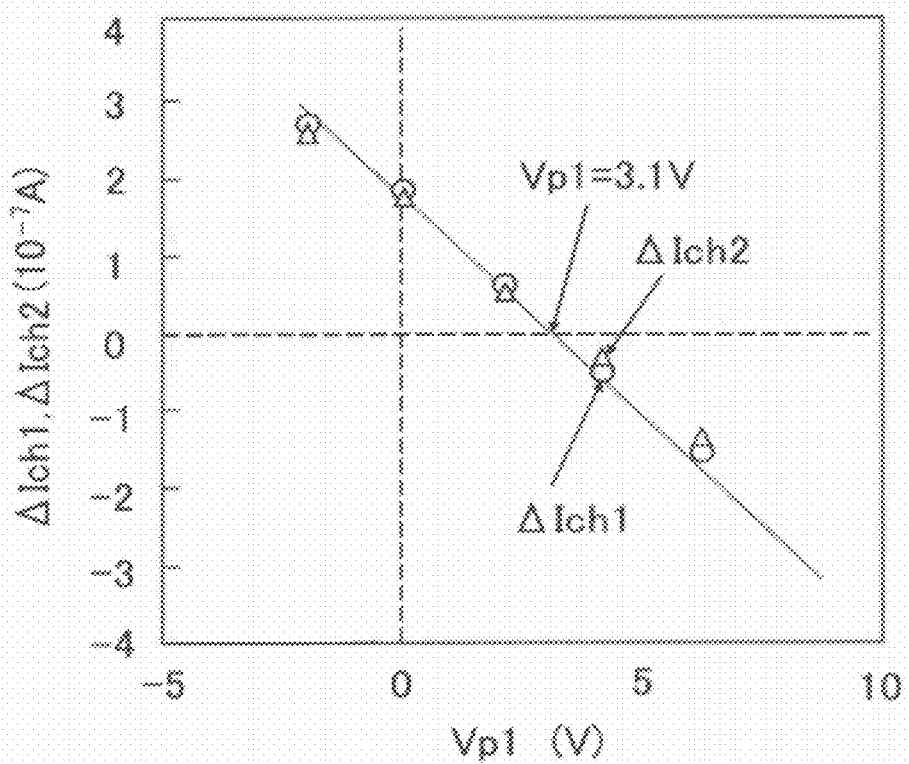
FIG. 10 is a schematic graph illustrating the evaluated results of the characteristics of the nonvolatile semiconductor memory device according to the first embodiment.

FIG. 10 is a schematic graph illustrating the evaluated results of the characteristics of the nonvolatile semiconductor memory device according to the first embodiment.

The horizontal axis in FIG. 10 represents the voltage Vp1 of the first pre-pulse Pp1, and the vertical axis represents the channel current fluctuations ΔIch1 and ΔIch2.

As illustrated in FIG. 10, as the voltage Vp1 of the first pre-pulse Pp1 changes, the channel current fluctuations ΔIch1 and ΔIch2 are varied. It is the state in which the first pre-pulse Pp1 is not applied where the voltage Vp1 is 0 V, which corresponds to the case of the comparative example, for example, as illustrated in FIG. 7A, FIG. 7B, FIG. 7C, FIG. 8A, FIG. 8B, and FIG. 8C.

ΔIch1 and ΔIch2 are about $1.8 \times 10^{-7}$ A where the voltage Vp1 is 0 V. This means that in the case of the comparative example illustrated in FIG. 7A, FIG. 7B, FIG. 7C, FIG. 8A, FIG. 8B, and FIG. 8C, the channel current is increased by this value during the application of the experimental pulses Pex1 to Pex5 and during the application of the experimental pulses Pex28 to Pex32 (where i=28 to 32). It is considered that this increase in the channel current is mainly caused due to the dielectric relaxation phenomenon in the high dielectric material used for the second insulating film 3C.

Since data is identified by detecting a channel current in the flash memory, there is a probability that such a channel current fluctuation causes data to be read wrongly, and this results in a practical problem.

At this time, in the nonvolatile semiconductor memory device 101 according to this embodiment, the first pre-pulse Pp1 is applied, and the voltage Vp1 is set to about 2 to 4 V, more specifically to 3.1 V, for example. By this, as illustrated in FIG. 10, the channel current fluctuations ΔIch1 and ΔIch2 are substantially zero.

In other words, there is the effect to preform the dielectric polarization being generated in the application of the read pulse group Pra to the memory cells M in at least one of the first insulating film 3A and the second insulating film 3C by applying the first pre-pulse Pp1. Thus, it is possible to perform a stable operation.

As described above, by the nonvolatile semiconductor memory device 101 according to this embodiment, even though characteristic fluctuations are generated, which are caused by dielectric relaxation due to the high dielectric material, the first pre-pulse Pp1 is used to average the characteristics as much as possible. Thus, it is made possible to perform a stable read operation In the experiment explained with reference to FIG. 9 and FIG. 10, the characteristics were evaluated in the case where the time duration T3 of the first pre-pulse Pp1 was relatively long, which was about 10 times the application time of the total of the read pulse Pr and the transmission pulses Ps. However, it may be possible that the time duration T3 of the first pre-pulse Pp1 is much shorter, as explained below.

Second Experiment

Figure 11:
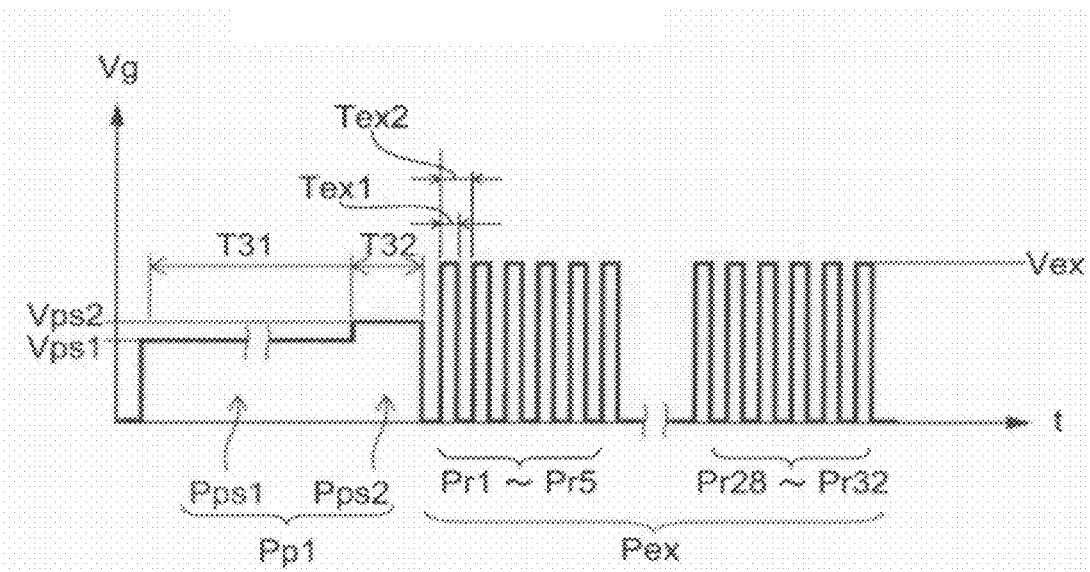
FIG. 11 is a schematic view illustrating waveforms used for another evaluation experiment of the characteristics of the nonvolatile semiconductor memory device according to the first embodiment.

FIG. 11 is a schematic view illustrating waveforms used for another evaluation experiment of the characteristics of the nonvolatile semiconductor memory device according to the first embodiment.

As illustrated in FIG. 11, in another evaluation experiment, the first pre-pulse Pp1 includes two pulses, i.e. a first sub-pre-pulse Pps1 and a second sub-pre-pulse Pps2. The second sub-pre-pulse Pps2 is applied between the first sub-pre-pulse Pps1 and the experimental pulse Pex.

The first sub-pre-pulse Pps1 has a voltage Vps1 and time duration T31. The second sub-pre-pulse Pps2 has a voltage Vps2 and time duration T32.

In this experiment, the characteristics were evaluated where the second sub-pre-pulse Pps2 applied immediately before the experimental pulse Pex was fixed and the first sub-pre-pulse Pps1 was varied. More specifically, the voltage Vps2 of the second sub-pre-pulse Pps2 was set to 3 V, and the time duration T32 was set to 1 ms. The value (3 V) of this voltage Vps2 was set based on the experimental result explained with reference to FIG. 10.

The time duration T32 of the first sub-pre-pulse Pps1 was set to 9 ms, the voltage Vps1 was varied, and then the channel current fluctuations ΔIch1 and ΔIch2 were evaluated. The experimental pulse Pex and the configuration of the evaluated memory cells M were the same as those in the first experiment.

Figure 12:
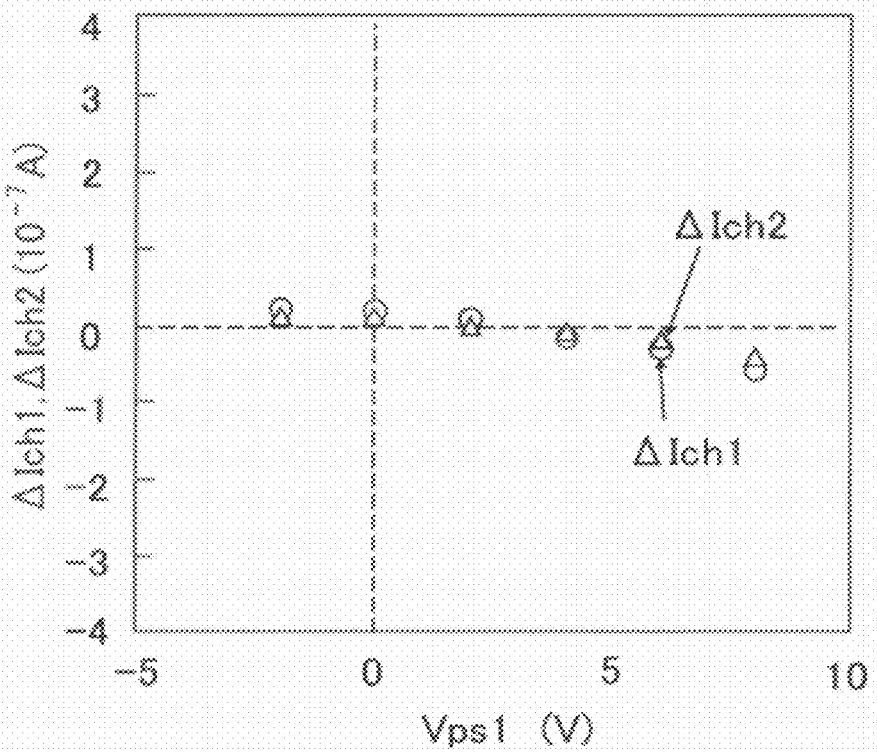
FIG. 12 is another schematic graph illustrating the evaluated results of the characteristics of the nonvolatile semiconductor memory device according to the first embodiment.

FIG. 12 is another schematic graph illustrating the evaluated results of the characteristics of the nonvolatile semiconductor memory device according to the first embodiment.

The horizontal axis in FIG. 12 represents the voltage Vps1 of the first sub-pre-pulse Pps1, and the vertical axis represents the channel current fluctuations ΔIch1 and ΔIch2.

As illustrated in FIG. 12, even though the voltage Vps1 of the first sub-pre-pulse Pps1 is varied, the channel current fluctuations ΔIch1 and ΔIch2 are almost constant, nearly zero. More specifically, the second sub-pre-pulse Pps2, which the voltage Vps2 is 3 V and the time duration T32 is 1 ms, is applied immediately before the experimental pulse Pex, so that the channel current fluctuations ΔIch1 and ΔIch2 become nearly zero.

This reveals that it is sufficient that the time duration T3 of the first pre-pulse Pp1 is about 1 ms or more, i.e. about the application time of the total of the read pulse Pr and the transmission pulses Ps or more. In other words, desirably, the time duration T3 of the first pre-pulse Pp1 is the time duration Tr, during which the read pulse Pr is applied to all the memory cells M included in the memory string MS, or more.

In this experiment, instead of the memory string having n cells of the memory cells M aligned, the waveforms applied to a single memory cell M were varied for evaluating the characteristics. For example, in the experimental pulse Pex (read pulse group Pra) illustrated in FIG. 9, the first pulse (experimental pulse Pex1) corresponds to the read pulse for the memory cell M1, which is first read in the memory string MS, and the last pulse (experimental pulse Pex32) corresponds to the read pulse for the memory cell M32, which is last read in the memory string MS.

At this time, because all the memory cells M1 to Mn are subjected to the similar read pulse group Pra, it can be estimated that the operation is similarly and stably performed in all the memory cells M1 to Mn if the operation is stably performed in one of the memory cells M1 to Mn. More specifically, if a single memory cell Mi outputs a temporally stable channel current, all the memory cells M1 to Mn included in the same memory string MS are also temporally stable.

In the experimental result explained with reference to FIG. 10 and FIG. 12, the voltage Vp1 of the first pre-pulse Pp1 was appropriate at about 3 V. In other words, preferably, the voltage Vp1 of the first pre-pulse Pp1 was set to substantially the same voltage as the average voltage Vave of the transmission pulse Ps for reading data in the memory cells.

However, it is possible to set the voltage Vp1 of the first pre-pulse Pp1 based on the degree of relaxation in the memory cells provided in the nonvolatile semiconductor memory device 101 and on the variations in the threshold caused by relaxation acceptable between the memory cells at the same threshold level.

For example, as illustrated in FIG. 10, current fluctuations with a width of 1.8×10-7 A are observed at the first five points. On the other hand, because a trans-conductance Gm ranges from about $1\times10^{-6}$ to $1\times10^{-5}$ A/V where the voltage Vex (the voltage Vr and the voltage vs) of the memory cells M used for the experiment is 6 V, an amount of fluctuations in the threshold, which is derived as a calculation from the current fluctuations, ranges from about 0.018 to 0.18 V. Here, this experimental result is an experimental result between five memory cells, and in consideration that the number of the memory cells in the memory string is 32, fluctuations are generated in the threshold at about 0.1 to 1 V as a whole by 32/5 times, i.e. about six times.

From the above, in the comparative example that does not use the first pre-pulse Pp1, it can be estimated that threshold fluctuations are generated at about 1 V at the maximum when reading data in the memory string MS including 32 cells of the memory cells M.

In the nonvolatile semiconductor memory device 101 according to this embodiment, the voltage Vp1 of the first pre-pulse Pp1 is to set in the range of the voltage (Vx−Vdx) to the voltage (Vx+Vdx), in order to reduce these threshold fluctuations in the memory cells M less than the allowable value ΔVt.

Here, the voltage Vx can be the voltage Vpave of the read pulse group Pra in the time average. At this time, because the read pulse group Pra includes a single read pulse Pr and n pulses of the transmission pulse Ps, it is possible to substantially adopt the voltage of the transmission pulses Ps in the time average for the voltage Vpave of the read pulse group Pra in the time average if n is greater.

In other words, in the case where the transmission pulse Ps is a pulse at a 50% duty, it is possible to set the voltage Vx to about a half of the voltage Vs of the transmission pulse Ps.

As described above, the voltage Vp1 (voltage Vx) of the first pre-pulse Pp1 is set to the voltage Vpave of the read pulse group Pra in the time average, thereby exerting the effect to preform the dielectric polarization being generated in the application of the read pulse group Pra to the memory cells M using the first pre-pulse Pp1.

As illustrated in FIG. 10, because it is supposed that threshold fluctuations are generated ranging from about 0.1 to 1 V when the voltage Vp1 of the first pre-pulse Pp1 is varied at 3 V, the voltage Vdx ranges from 3×ΔVt to 30×ΔVt, in order to reduce the threshold fluctuations less than the allowable value ΔVt.

For example, suppose that the allowable value ΔVt of threshold fluctuations is set to 0.1 V, preferably, the voltage Vp1 of the first pre-pulse Pp1 ranges from (Vx−3) to (Vx+3) volts. However, in order to adequately determine the voltage Vp1, more preferably, the range is set from (Vx−0.3) to (Vx+0.3) volts. In order to further reduce threshold fluctuations, the allowable value ΔVt is set to 0.01 V or the like, for example; the voltage Vp1 of the first pre-pulse Pp1 ranges from (Vx−0.03) to (Vx+0.03) volts at this time.

On the other hand, as already explained, it is sufficient that the time duration T3 of the first pre-pulse Pp1 is 1 ms or more. In order to exert the effect to preform the dielectric polarization being generated in the application of the read pulse group Pra to the memory cells M using the first pre-pulse Pp1, more preferably, the time duration T3 of the first pre-pulse Pp1 is set to the time duration of the read pulse group Pra or more. In other words, more preferably, the time duration T3 of the first pre-pulse Pp1 is set to n times the time duration T12 of the read pulse Pr or more. More desirably, it is set to n times the period (time) T22 of the transmission pulse Ps or more.

Figure 13A:
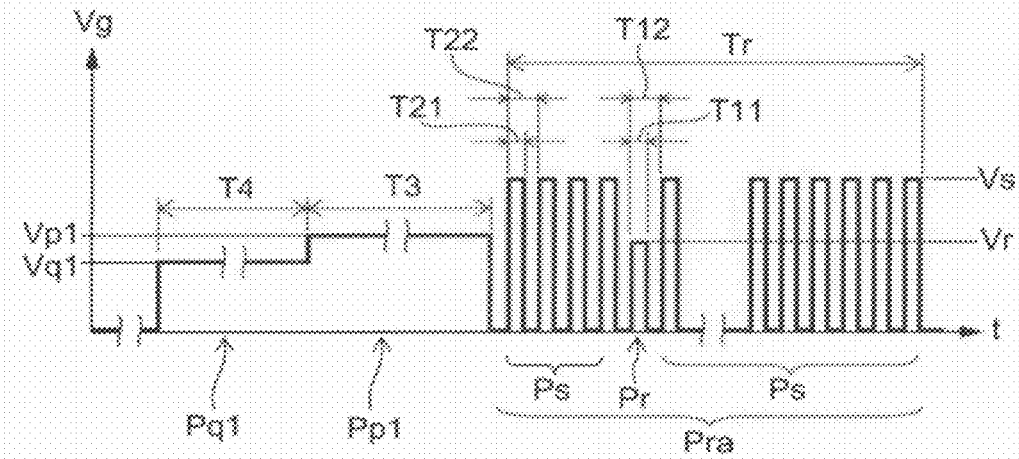
FIG. 13A and FIG. 13B are schematic views illustrating another operation of the nonvolatile semiconductor memory device according to the first embodiment.
Figure 13B:
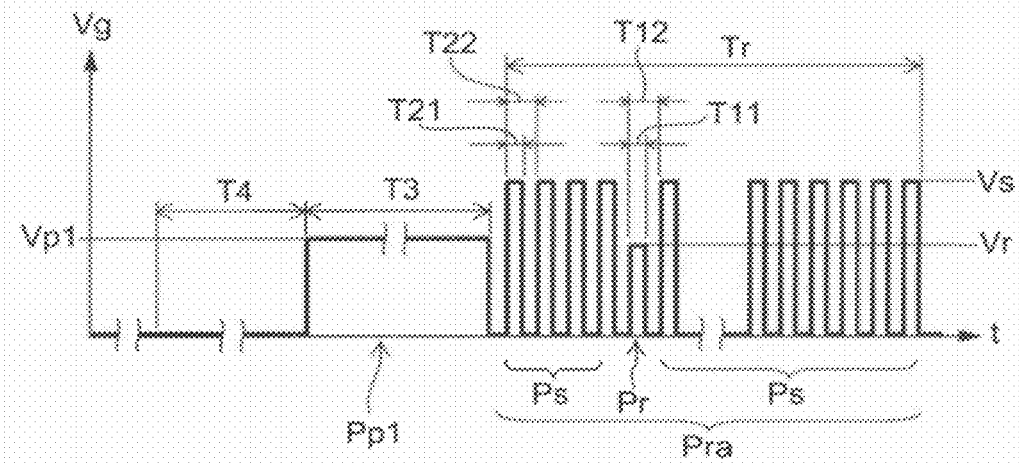

FIG. 13A and FIG. 13B are schematic views illustrating another operation of the nonvolatile semiconductor memory device according to the first embodiment.

More specifically, FIG. 13A and FIG. 13B illustrate two types of operations of the nonvolatile semiconductor memory device 101.

As illustrated in FIG. 13A, a first prepositional pulse Pq1 (a fourth signal) is applied immediately prior to the application of the first pre-pulse Pp1, whose voltage is a voltage Vq1 and whose width is time duration T4 (a first period). More specifically, in all the memory cells M included in the memory string MS, the first prepositional pulse Pq1 is applied to the word lines WL1 to WLn, which are the gate electrodes 4, at the same time. At this time, it is sufficient that the first prepositional pulse Pq1 is not necessarily applied at the same time to all the memory cells M if the state prior to the application of the first pre-pulse Pp1 is substantially in the same state in all the memory cells M. However, the first prepositional pulse Pq1 always has timing at which the pulse is applied at the same time in all the memory cells M. In the following, an explanation will be given in the case where the first prepositional pulse Pq1 is applied to all the memory cells M at the same time.

As illustrated in FIG. 13B, the gate voltage $V_G$ is set to zero volt for the time duration T4 immediately prior to the application of the first pre-pulse Pp1. More specifically, the potentials of the gate electrode 4 and the semiconductor layer 1 are set to the same potential at the same time in all the memory cell M included in the memory string MS. This driving method corresponds to the case illustrated in FIG. 13A where the voltage Vq1 of the first prepositional pulse Pq1 is zero volt. At this time, it is sufficient that the potentials of the gate electrode 4 and the semiconductor layer 1 are not necessarily set to the same potential at the same time if the state prior to the application of the first pre-pulse Pp1 is substantially in the same state in all the memory cells M. In the following, an explanation will be given in the case where the potentials of the gate electrode 4 and the semiconductor layer 1 are set to the same potential at the same time in all the memory cells M.

It may be possible to apply the potential by mixing the potential states illustrated in FIG. 13A and FIG. 13B. More specifically, for example, it may be possible that the first prepositional pulse Pq1 is applied to all the memory cells M at the same time as illustrated in FIG. 13A, the potentials of the gate electrode 4 and the semiconductor layer 1 of all the memory cells are set to the same potential at the same time for a certain time period as illustrated FIG. 13B, and then the first pre-pulse Pp1 is applied.

Figure 14:
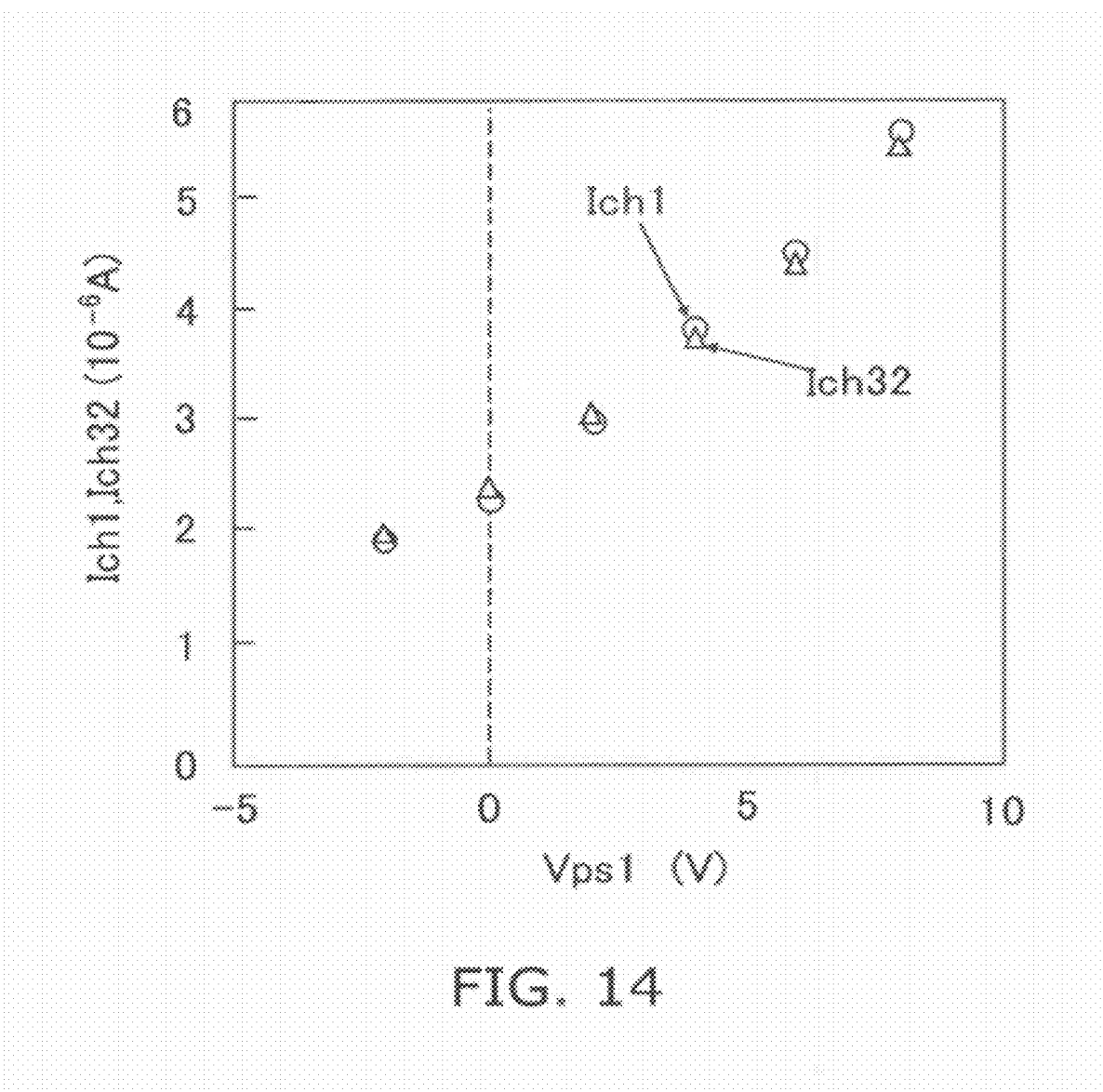
FIG. 14 is another schematic graph illustrating the evaluated results of the characteristics of the nonvolatile semiconductor memory device according to the first embodiment.

FIG. 14 is another schematic graph illustrating the evaluated results of the characteristics of the nonvolatile semiconductor memory device according to the first embodiment.

More specifically, FIG. 14 illustrates the values of a channel current Ich1 when applying the first experimental pulse Pex1 for the first memory cell M1 and the values of a channel current Ich32 when applying the last experimental pulse Pex32 for the last memory cell M32 in the second experiment illustrated in FIG. 11 and FIG. 12. The horizontal axis in FIG. 14 represents the voltage Vps1 of the first sub-pre-pulse Pps1, and the vertical axis represents the channel currents Ich1 and Ich32.

As illustrated in FIG. 14, the channel currents Ich1 and Ich32 are varied with respect to the change in the voltage Vps1 of the first sub-pre-pulse Pps1.

More specifically, as described with reference to FIG. 12, the channel current fluctuation ΔIch1, which is fluctuations where i=1 to 5, and the channel current fluctuation ΔIch2, which is fluctuations where i=28 to 32, are nearly zero even though the voltage Vps1 is varied. However, as illustrated in FIG. 14, the value of the channel current Ich itself is changed in Ich1 where i=1 and in Ich32 where i=32, when the voltage Vps1 is varied.

More specifically, the characteristics of the memory cell M are affected by the history of the voltage having been applied until the focused time, showing the characteristics as illustrated in FIG. 14.

At this time, as explained with reference to FIG. 13A and FIG. 13B, at least one of steps is performed: applying the first prepositional pulse Pq1 to the gate electrodes 4 of the memory cells M prior to the application of the first pre-pulse Pp1; and setting the potential of the gate electrode 4 to the same potential as that of the semiconductor layer 1, so that it is possible to keep the degree of the dielectric relaxation in the individual memory cells M constant all the time at every time when the read operation is performed.

More specifically, the individual memory cells M are set in the aforementioned state for the time duration T4 long enough, so that it is possible to cancel the history due to dielectric relaxation.

For example, the aforementioned time duration T4 can be set to 10 ms or more.

In other words, in the case where the time duration T31 of the first sub-pre-pulse Pps1 is 9 ms and the time duration T32 of the second sub-pre-pulse Pps2 is 1 ms, which are the conditions for the second experiment, because the voltage Vps1 of the first sub-pre-pulse Pps1 with a time duration of 9 ms affects the channel currents Ich1 and Ich2, desirably, the time duration T3 is longer than 9 ms. Consequently, it can be considered that desirably, the time duration T4 is set at least longer than 9 ms, and desirably, the time duration T4 is set to 10 ms or more, which is the time duration of the read pulse group Pra, for example, or more (n times the time duration T12 of the read pulse Pr, i.e. n times the period (time) T22 of the transmission pulse Ps).

More desirably, the time duration T4 is 100 ms or more.

In addition, desirably, the voltage Vq1 of the first prepositional pulse Pq1 is set in such a way that the electric field caused by the voltage Vq1 and applied to the first insulating film 3A is lower than 10 MV/cm (megavolts/centimeter), in order not to program or erase data in the memory cells M during the application of this first prepositional pulse Pq1.

In the above description, at least one of the steps is performed: applying the first prepositional pulse Pq1 to the gate electrodes 4 of the memory cells M prior to the application of the first pre-pulse Pp1; and setting the potential of the gate electrode 4 to the same potential as that of the semiconductor layer 1. However, it is also possible to perform one of steps of: applying the read pulse Pr (a first signal) to at least one of the memory cells M in the memory string MS without applying the first pre-pulse Pp1 and then applying the first prepositional pulse Pq1 to the gate electrodes 4 of the memory cells M before reading data stored in the memory cells M; and setting the potential of the gate electrode 4 to the same potential as that of the semiconductor layer 1.

Figure 15:
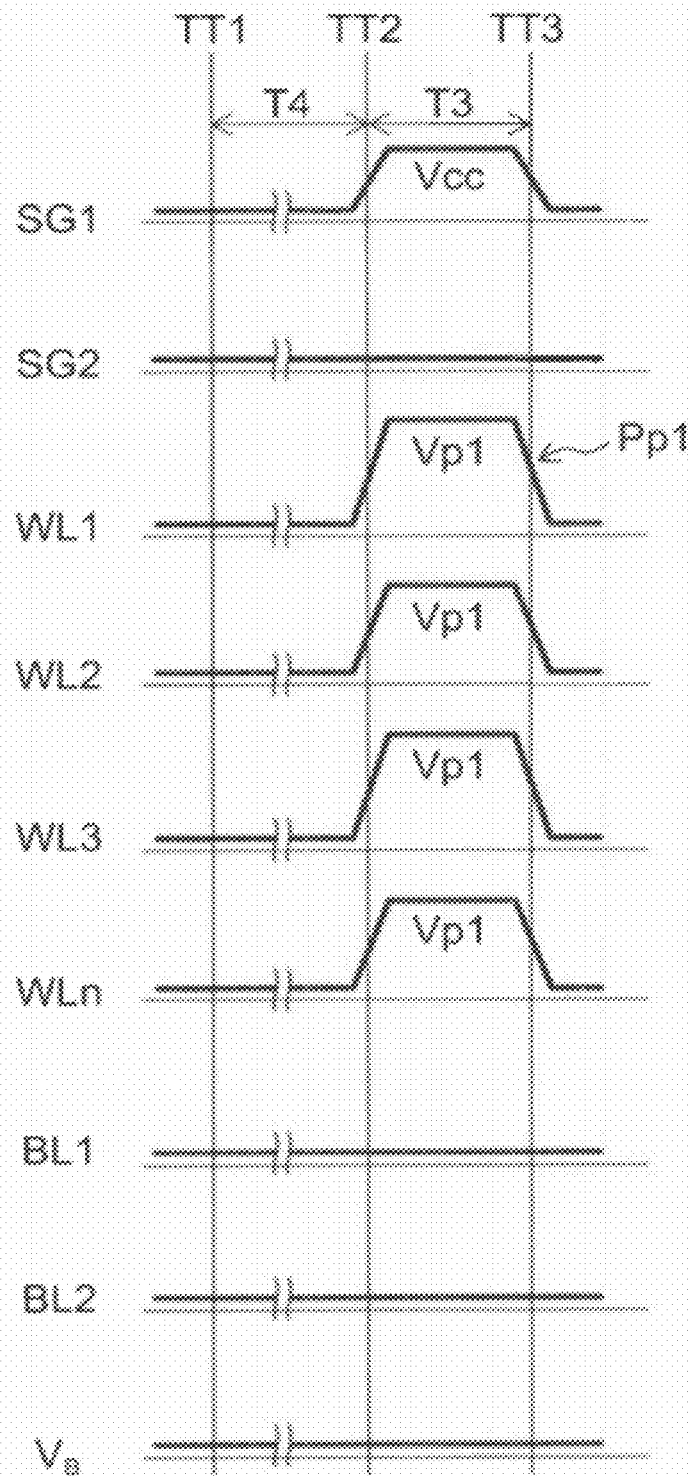
FIG. 15 is another schematic view illustrating the operation of the nonvolatile semiconductor memory device according to the first embodiment.

FIG. 15 is another schematic view illustrating the operation of the nonvolatile semiconductor memory device according to the first embodiment.

More specifically, FIG. 15 illustrates a time chart showing voltages applied to the first and second select gates SG1 and SG2, the word lines WL1 to WLn, and the bit lines BL1 and BL2 connected to the memory string MS illustrated in FIG. 3 and the back bias voltage $V_B$ of the semiconductor layer 1.

As illustrated in FIG. 15, for the time duration T4 from a time TT1 to a time TT2, the potentials of all the word lines WL1 to WLn are set to the same potential as that of the back bias potential. More specifically, the potentials of the gate electrodes 4 of all the memory cells M1 to Mn can be set to the same potential as that of the semiconductor layer 1 at the same time. In other words, the relationship between the potentials in FIG. 13B can be provided. It may be possible to provided the relationship between the potentials illustrated in FIG. 13A.

The first pre-pulse Pp1, i.e. the voltage Vp1, is applied to all the word lines WL1 to WLn for the time duration T3 from the time TT2 to time TT3. The voltage Vp1 is applied to all the gate electrodes 4 of the memory cells M1 to Mn at the same time. In addition, a high level voltage Vcc is applied to the first select gate SG1 for the period from the time TT2 to the time TT3.

Although not shown in the drawing, the read pulse (voltage Vr) and the transmission pulse Ps (voltage Vs) are sequentially applied to the word lines WL1 to WLn after the time TT2.

The individual operations above are performed by the driving unit 20 connected to the individual memory cells M1 to Mn. It is also possible to form at least a part of the driving unit 20 with the same semiconductor layer as the semiconductor layer 1, in which the memory cells M1 to Mn are provided. It is also possible to form the driving unit 20 on a semiconductor substrate or the like different from the semiconductor layer 1.

In addition, it is also possible to apply the operation of the nonvolatile semiconductor memory device 101 described above to the read operation by pre-charge described in JP-A 2008-287831 (Kokai), for example.

In pre-charge, such a method is applied that in sequentially reading data stored in the memory cells M1 to Mn, a pre-charge voltage is applied prior to the application of the read pulse to each of the memory cells M1 to Mn. More specifically, the pre-charge voltage is first applied to the ith memory cell Mi and then the read pulse is applied. This is repeated in all the memory cells M1 to Mn. Thus, in the case of using only pre-charge, there is no effect to reduce differences in the history prior to the application of the read pulse to the memory cells M1 to Mn. Because of this, the read operation is unstable in the case where there is the dielectric relaxation phenomenon.

On the contrary, in this embodiment, the same first pre-pulse is first applied to all the memory cells M1 to Mn at the same time, so that it is possible to reduce differences in the history prior to the application of the read pulse Pr to the individual memory cells M1 to Mn. Consequently, it is made possible to perform a stable read operation even though characteristic fluctuations are generated, which are caused by dielectric relaxation.

In the case of applying this embodiment to pre-charge, the same first pre-pulse is applied to all the memory cells M1 to Mn at the same time, and then the pre-charge voltage is applied prior to the application of the read pulse to each of the memory cells M1 to Mn. This also allows a reduction in differences in the history prior to the application of the read pulse, and it is made possible to perform a stable read operation.

Second Embodiment

In a second embodiment, a verify-program operation is stabilized. Because the configurations of a memory cell M and a memory string MS for use in a nonvolatile semiconductor memory device 121 according to this embodiment (not shown) can be the same as those in one of the nonvolatile semiconductor memory devices 101 and 102 according to the first embodiment, the description is omitted. In the nonvolatile semiconductor memory device 121 according to this embodiment, the operation of a driving unit 20 is different from that of the first embodiment, and an explanation will now be given in terms of this operation.

Figure 16:
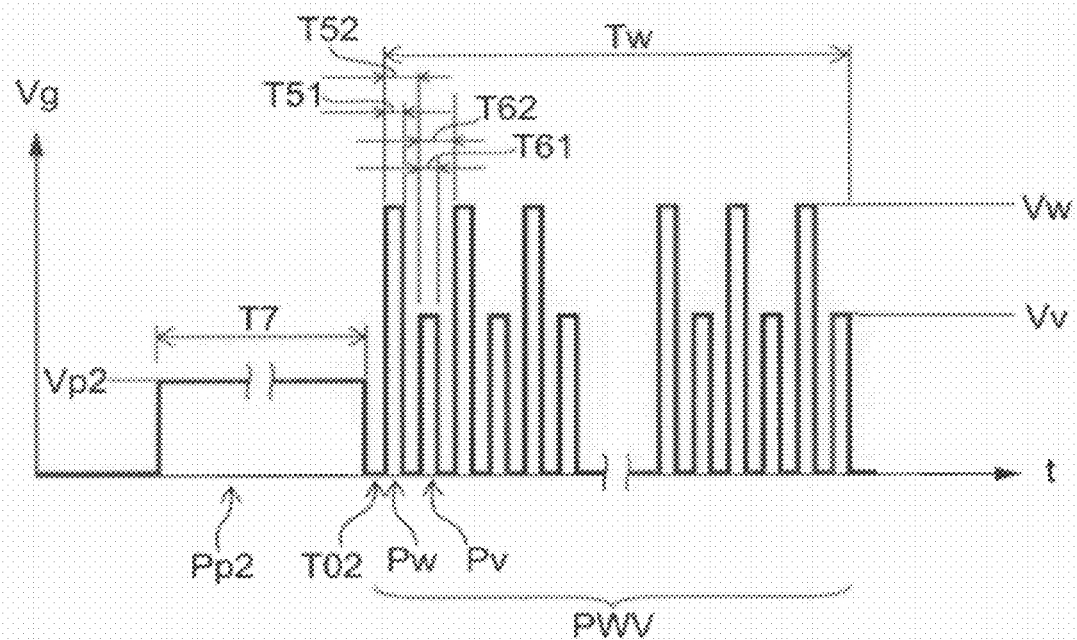
FIG. 16 is a schematic view illustrating the operation of a nonvolatile semiconductor memory device according to a second embodiment.

FIG. 16 is a schematic view illustrating the operation of the nonvolatile semiconductor memory device according to the second embodiment.

More specifically, FIG. 16 illustrates the operation in the verify-program operation performed in a single memory cell M of the nonvolatile semiconductor memory device 121. The horizontal axis in FIG. 16 represents time t, and the vertical axis represents a gate voltage $V_G$.

As illustrated in FIG. 16, a pulse train PWV for the verify-program operation is applied to the memory cells M in the memory string MS. In the pulse train PWV, a program pulse Pw (a fifth signal) is first applied to a memory cell M. A verify pulse Pv (a sixth signal) is then applied to this memory cell M for reading the threshold of the memory cell M. The program pulse Pw and the verify pulse Pv are repeatedly applied until the threshold reaches a desired level. Time duration Tw of the pulse train PWV changes depending on the number of times to perform program and verify operations.

The voltage of the program pulse Pw is a voltage Vw, and the width of the program pulse Pw is time duration T51, having a period (time) T52 from a point in time immediately after the application of the program pulse Pw to a point in time when the verify pulse Pv is inputted.

On the other hand, the voltage of the verify pulse Pv is a voltage Vv, and the width of the verify pulse Pv is time duration T61, having a period (time) T62 from a point in time immediately after the application of the verify pulse Pv to a point in time when the program pulse Pw is inputted.

The voltage Vv of the verify pulse Pv is set lower than the voltage Vw of the program pulse Pw.

As illustrated in FIG. 16, in this embodiment, prior to this verify-program operation, a second pre-pulse Pp2 (a seventh signal) is applied to a memory cell to which the verify-program operation is performed.

More specifically, prior to the application of the fifth signal (the program pulse Pw) that programs data in a memory cell (a third cell), which is at least one of the memory cells M in the memory string MS, and the sixth signal (the verify pulse Pv) that verify-reads the programmed data, the driving unit 20 applies the seventh signal (the second pre-pulse Pp2) to the gate electrode 4 of the third cell. The third cell is a memory cell to which the fifth and sixth signals are applied, that is, to which the verify-program operation is performed.

The voltage of the second pre-pulse Pp2 is a voltage Vp2, and the width of the second pre-pulse Pp2 is time duration T7.

The voltage Vp2 of the second pre-pulse Pp2 is lower than the voltage Vw of the program pulse Pw. More specifically, the absolute value of the voltage Vp2 of the second pre-pulse Pp2 is smaller than the absolute value of the voltage Vw of the program pulse Pw.

In this specific example, an idle period T02 is provided between the second pre-pulse Pp2 and the first program pulse Pw. However, it may be possible that the idle period T02 is not provided and the voltage is directly varied from the voltage Vp2 of the second pre-pulse Pp2 to the voltage Vw of the program pulse Pw.

In the flash memory, in performing the verify-program operation, pluralities of program pulses Pw and verify pulses Pv are applied to the individual memory cells M1 to Mn until the threshold reaches a desired threshold level. Even though it is supposed that the memory cells M1 to Mn are programmed at the same threshold level, the memory cells M1 to Mn individually have variations. Thus, the numbers of times to apply the program pulse Pw and the verify pulse Pv are not always the same among the individual memory cells M1 to Mn. More specifically, the length of the pulse train PWV of the verify-program operation is sometimes varied.

As already explained, in the case where dielectric polarization is larger in the first and second insulating films 3A and 3C or in at least one of the first and second insulating films 3A and 3C of a memory cell M, the history of the voltage having been applied to this memory cell M until the focused time affects the characteristics.

At this time, in the case of the comparative example where the second pre-pulse Pp2 is not used, if the length of the pulse train PWV is varied between the memory cells M1 to Mn, a current amount detected in the verify operation is not always the same, causing a difficulty in determining that the individual memory cells are programmed at the same threshold level.

On the contrary, in the nonvolatile semiconductor memory device 121 according to this embodiment, the second pre-pulse Pp2 (the seventh signal) is applied to the memory cell M, to which this verify-program operation is performed, prior to the verify-program operation that varies in each of the memory cells M like this, so that it is possible to stabilize the verify operation in the verify-program operation, and as a consequence, it is made possible to implement a stable program operation.

The operation described above is performed by the driving unit 20.

In the following, experimental results will be described concerning the effect of the nonvolatile semiconductor memory device 121 according to this embodiment.

Third Experiment

Because a memory cell M for use in the experiment is the same as the memory cells M used in the first and second experiments, the description is omitted. The waveforms illustrated in FIG. 16 were applied to the memory cell M for measuring the channel current of the memory cell M.

More specifically, the voltage Vw of the program pulse Pw was set to 10 V, the time duration T51 was set to 10 µs, and the period (time) T52 from a point in time immediately after the application of the program pulse Pw to a point in time at input of the verify pulse Pv was set to 20 µs. The voltage Vv of the verify pulse Pv was set to 6 V, the time duration T61 was set to 20 µs, and the period (time) T62 from a point in time immediately after the application of the verify pulse Pv to a point in time at input of the program pulse Pw was set to 30 µs.

The applications of a single program pulse Pw and a single verify pulse Pv were paired for a single verify-program operation, and evaluation was made for a channel current Ichv1 where a single pair was applied to the memory cell M, a channel current Ichv9 where nine pairs were applied to the memory cell M, and a channel current fluctuation ΔIchv3 that was a difference between them.

At this time, the time duration T7 of the second pre-pulse Pp2 was set to 1 ms, the voltage Vp2 was varied, and then changes in the aforementioned channel current Ichv1, channel current Ichv9, and channel current fluctuation ΔIchv3 were evaluated.

Figure 17A:
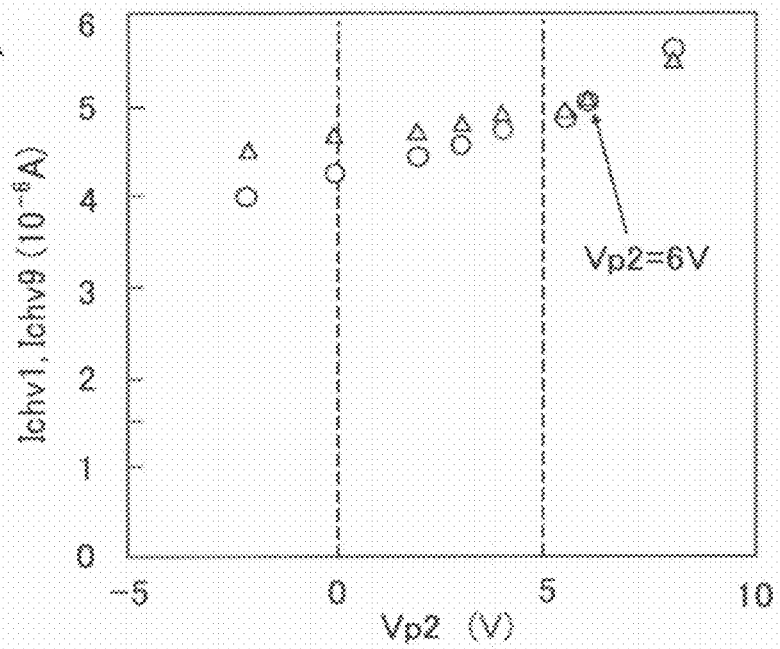
FIG. 17A and FIG. 17B are schematic graphs illustrating the evaluated results of the characteristics of the nonvolatile semiconductor memory device according to the second embodiment.
Figure 17B:
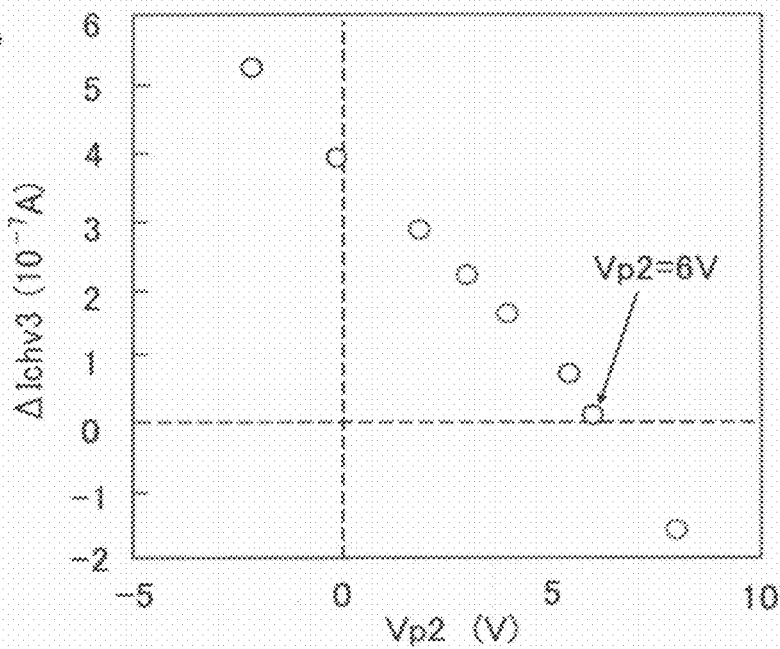

FIG. 17A and FIG. 17B are schematic graphs illustrating the evaluated results of the characteristics of the nonvolatile semiconductor memory device according to the second embodiment.

The horizontal axis in FIG. 17A represents the voltage Vp2, and the vertical axis represents the channel currents Ichv1 and Ichv9. The horizontal axis in FIG. 17B represents the voltage Vp2 of the second pre-pulse Pp2, and the vertical axis represents the channel current fluctuation ΔIchv3.

In these drawings, the case where the voltage Vp2 is zero volts corresponds to the comparative example.

As illustrated in FIG. 17A, the channel current Ichv1 for which a single verify-program operation was performed, and the channel current Ichv9 for which nine verify-program operations were performed are increased as the voltage Vp2 of the second pre-pulse Pp2 increases. In the case of the comparative example where the voltage Vp2 is zero volts, a difference between the channel current Ichv1 and the channel current Ichv9 is large. In the case where the voltage Vp2 is six volts, which corresponds to this embodiment, the channel current Ichv1 and the channel current Ichv9 are almost the same.

In other words, as illustrated in FIG. 17B, the channel current fluctuation ΔIchv3 is greatly changed depending on the value of the voltage Vp2 of the second pre-pulse Pp2. In the case of the comparative example where the voltage Vp2 is zero volts, the channel current fluctuation ΔIchv3 is as large as about $4 \times 10^{-7}$ A.

On the contrary, in the case of this embodiment, the channel current fluctuation ΔIchv3 is nearly zero, when the second pre-pulse Pp2 is applied and the voltage Vp2 is 6 V, for example.

More specifically, the second pre-pulse Pp2 having almost the same voltage as the voltage Vv of the verify pulse Pv is applied, so that it is made possible that the channel current fluctuation ΔIchv3 caused by the differences in the number of times to apply the program pulse Pw and the verify pulse Pv is substantially zero in the verify-program operation.

From the results above, the appropriate range of the voltage Vp2 of the second pre-pulse Pp2 is as follows.

As illustrated in FIG. 17B, in the difference between a single and nine verify-program operations where the voltage Vp2 is zero volts, the channel current fluctuation ΔIchv3, which is about $4 \times 10^{-7}$ A, is observed. In consideration that the trans-conductance Gm ranges from about $1 \times 10^{-6}$ to $1 \times 10^{-6}$ A/V where the voltage Vv of the verify pulse Pv of the memory cell M is 6 V, an amount of fluctuations in the threshold, which is derived as a calculation from the channel current fluctuation $\Delta$Ichv3, ranges from about 0.04 to 0.4 V.

At this time, because the number of times to apply the pulses to the individual memory cells M is not known in advance in the verify-program operation, it is supposed here that the difference is a difference between a single and nine operations, and there are variations ranging from about 0.04 to 0.4 V in the threshold between the memory cells to have the same threshold.

In other words, in the case of the comparative example where the second pre-pulse Pp2 is not applied, it is supposed that there is a threshold fluctuation of about 0.4 V at the maximum in the verify-program operation. In order to reduce such threshold fluctuations in the memory cells M less than the allowable value $\Delta$Vt, the range of the voltage Vp2 of the second pre-pulse Pp2 is to be set in the range of the voltage (Vy−Vdy) to the voltage (Vy+Vdy).

Here, the voltage Vy can be set to the same voltage as the voltage Vv of the verify pulse Pv. Because it is supposed that there is a threshold fluctuation of about 0.4 V when the voltage Vp2 is varied to 6 V, the voltage is Vdy=15×$\Delta$Vt in order to reduce threshold fluctuations less than the allowable value $\Delta$Vt.

For example, if the allowable value $\Delta$Vt of threshold fluctuations is set to 0.1 V, the range of the voltage Vp2 of the second pre-pulse Pp2 ranges from (Vy−1.5) to (Vy+1.5) volts. In order to further reduce threshold fluctuations, for example, the allowable value $\Delta$Vt is set to 0.01 V or the like; at this time, the range of the voltage Vp2 of the second pre-pulse Pp2 ranges from (Vy−0.15) to (Vy+0.15) volts.

As already explained with reference to FIG. 17B, when the voltage Vp2 of the second pre-pulse Pp2 is 6 V, it is possible that the channel current fluctuation is nearly zero if the time duration T7 is set to about 1 ms. Thus, preferably, the time duration of the second pre-pulse Pp2 is 1 ms or more.

In consideration that there is the effect to preform the dielectric polarization being generated in the application of the pulse train PWV of the verify-program operation by applying the second pre-pulse Pp2, more preferably, the time duration of the second pre-pulse Pp2 is set to the application time of the pulse train PWV (time duration during which the program pulse Pw and the verify pulse Pv are applied to one of the memory cells M included in the memory string MS) or more.

As similar to the first embodiment, desirably, the state prior to the application of the second pre-pulse Pp2 is made to be further in the constant state.

Figure 18A:
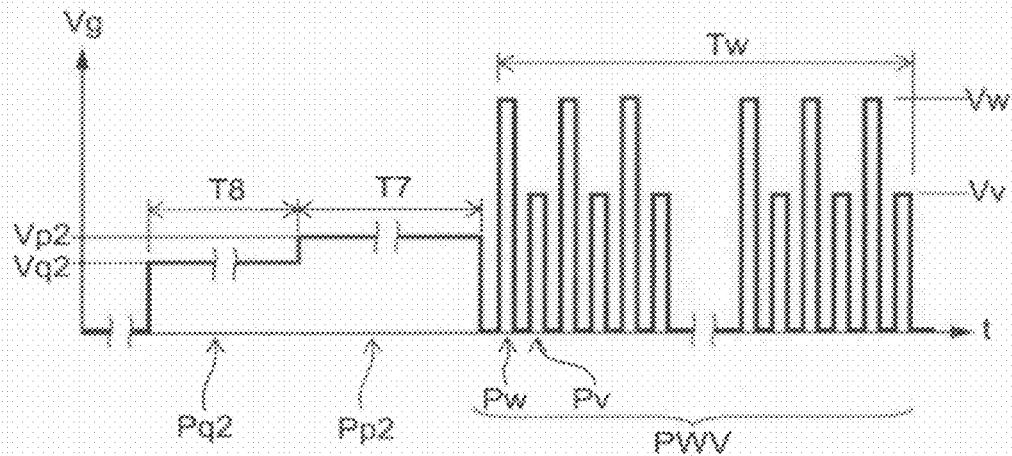
FIG. 18A and FIG. 18B are schematic views illustrating another operation of the nonvolatile semiconductor memory device according to the second embodiment.
Figure 18B:
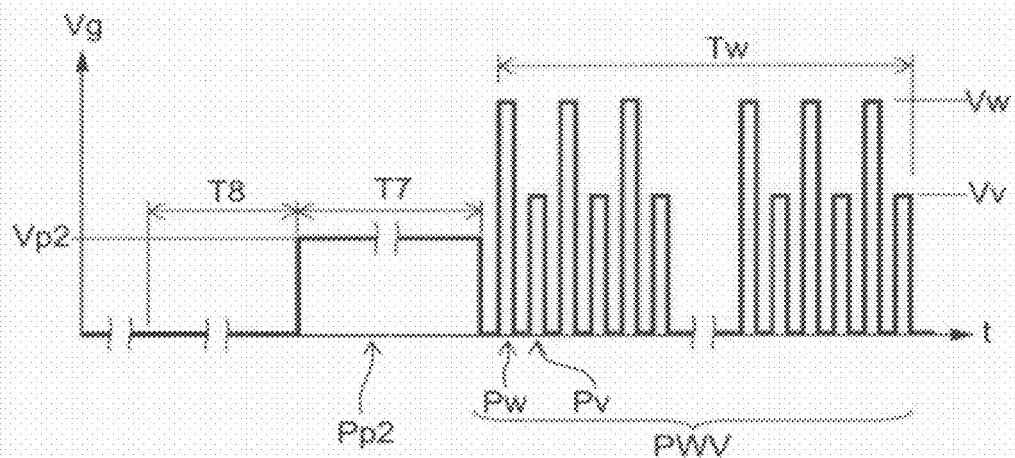

FIG. 18A and FIG. 18B are schematic views illustrating another operation of the nonvolatile semiconductor memory device according to the second embodiment.

More specifically, FIG. 18A and FIG. 18B illustrate two types of operations in the nonvolatile semiconductor memory device 121.

As illustrated in FIG. 18A, immediately prior to the application of the second pre-pulse Pp2, a second prepositional pulse Pq2 (a eighth signal) is applied to the gate electrodes 4 of the memory cells M, whose voltage is a voltage Vq2 and whose width is time duration T8 (a second period).

As illustrated in FIG. 18B, the gate voltage $V_G$ is set to zero volts for the time duration T8 immediately prior to the application of the second pre-pulse Pp2. More specifically, the potentials of the gate electrode 4 and the semiconductor layer 1 of the memory cell M are set to the same potential.

It may be possible to apply the potential by mixing the potential states illustrated in FIG. 18A and FIG. 18B.

As described above, at least one of steps is performed: applying the second prepositional pulse Pq2 to the gate electrodes 4 of the memory cells M immediately prior to the application of the second pre-pulse Pp2; and setting the potential of the gate electrode 4 to the same potential as that of the semiconductor layer 1. Thus, it is possible to further reduce the influence of differences in the dielectric relaxation in the individual memory cells M.

Here, desirably, the aforementioned time duration T8 is set longer than 1 ms.

More specifically, as already explained with reference to FIG. 17A and FIG. 17B, because the channel current fluctuation $\Delta$Ichv 3 fluctuates when the voltage Vp2 of the second pre-pulse Pp2, whose time duration T7 is 1 ms, is varied, the potential of the gate electrode 4 is stabilized for a relatively long time more than 1 ms. Thus, more preferably, the aforementioned time duration T8 is set to 10 ms or more, for example.

In addition, desirably, the voltage Vq2 of the second prepositional pulse Pq2 is set in such a way that the electric field caused by the voltage Vq2 and applied to the first insulating film 3A is lower than 10 MV/cm (megavolts/centimeter), in order not to program or erase data in the memory cells M during the application of this second prepositional pulse Pq2.

It is also possible to apply the foregoing operation of the nonvolatile semiconductor memory device 121 to the operation of step up programming described in JP-A 2005-276428 (Kokai), for example.

Moreover, it is also possible to combine the operations described in the first and second embodiments.

Third Embodiment

In a third embodiment, both of the read operation and the verify-program operation described in the first and second embodiments are stabilized. The operations are performed so as to match differences in the threshold, which may be generated in the read and verify-program operation.

Because the configurations of a memory cell M and a memory string MS for use in a nonvolatile semiconductor memory device 131 according to this embodiment (not shown) can be the same as those in any one of the nonvolatile semiconductor memory devices 101 and 102 according to the first embodiment, the description is omitted. In the nonvolatile semiconductor memory device 131 according to this embodiment, the operation of a driving unit 20 is different from that of the first embodiment, and an explanation will now be given in terms of this operation.

In the nonvolatile semiconductor memory device 131 according to this embodiment, the verify-program operation is performed by the operation according to the second embodiment illustrated in FIG. 16, for example, and then data is read by the operation according to the first embodiment illustrated in FIG. 1, for example.

At this time, the channel current when the last verify pulse Pv is applied in the verify-program operation is not always the same as the channel current when the read pulse Pr is applied in the read operation after that, even the case where the voltage Vv of the verify pulse Pv and the voltage Vr of the read pulse are the same voltage.

This is because the history of the voltage having been applied to the memory cell M until the focused time affects the characteristics if dielectric polarization is large in at least one of the first and second insulating films 3A and 3C.

More specifically, this is because the reference current of the channel current is different, since the pulse group, to which a memory cell M focused is subjected when the operation according to the second embodiment is applied, is different from the pulse group, to which that memory cell M is subjected when the operation according to the first embodiment is applied.

Thus, in the nonvolatile semiconductor memory device 131 according to this embodiment, the channel current (threshold) in the read operation according to the first embodiment is to be matched with the channel current (threshold) in the verify-program operation according to the second embodiment by the following methods.

A first method is as follows.

A threshold level always exists which is defined by a certain current level Ia. If there is only one current level Ia in the nonvolatile semiconductor memory device 131, a threshold level Vtb determined according to the second embodiment and a threshold level Vta determined according to the first embodiment are different from each other as already explained.

At this time, the threshold level Vta and the threshold level Vtb are considered to be at the same threshold level L1.

This operation is performed by the driving unit 20, for example.

Thus, even in the case where the channel current (threshold) in the read operation is different from the channel current (threshold) in the verify-program operation, these channel currents are matched with each other and programming and reading data are correctly performed.

A second method is as follows.

Also in this case, the threshold level Vtb defined by a certain current level Ia and determined according to the second embodiment and the threshold level Vta determined according to the first embodiment are used.

In this method, at least one of the voltage Vr of the read pulse Pr and the voltage Vv of the verify pulse Pv is adjusted (controlled) in such a way that the threshold level Vta and the threshold level Vtb are in the same program state.

This operation is performed by the driving unit 20, for example.

Also according to this second method, even in the case where the channel current (threshold) in the read operation is different from the channel current (threshold) in the verify-program operation when the voltage Vr and the voltage Vv are the same, the channel currents are matched with each other and programming and reading data are performed correctly.

Fourth Embodiment

A fourth embodiment relates to a method for driving a nonvolatile semiconductor memory device, and more particularly to a driving method for the read operation.

More specifically, this embodiment relates to a method for driving any one of the nonvolatile semiconductor memory devices 101 and 102 including the memory string MS having a plurality of memory cells M, for example. In the memory string MS, in sequentially reading data stored in the plurality of memory cells M by sequentially applying the read pulse Pr (a first signal) to each of the plurality of memory cells M, when applying the read pulse Pr to one memory cell M (a first cell) of the plurality of memory cells M, the transmission pulse Ps (a second signal), which transmits the data, is applied to the memory cells M (a second cells) except that one memory cell M (the first cell).

Each of the individual memory cells M includes the semiconductor layer 1 having the channel 1a and the source region 2a and the drain region 2b provided on both sides of the channel 1a, the first insulating film 3A provided on the channel 1a, the charge retention layer 3B provided on the first insulating film 3A, and the gate electrode 4 provided on the charge retention layer 3B. It is also possible that the aforementioned memory cell M further has the second insulating film 3C between the charge retention layer 3B and the gate electrode 4.

The driving method according to this embodiment is preferably used in the case where a high dielectric material is used for at least one of the first insulating film 3A and the second insulating film 3C.

Figure 19:
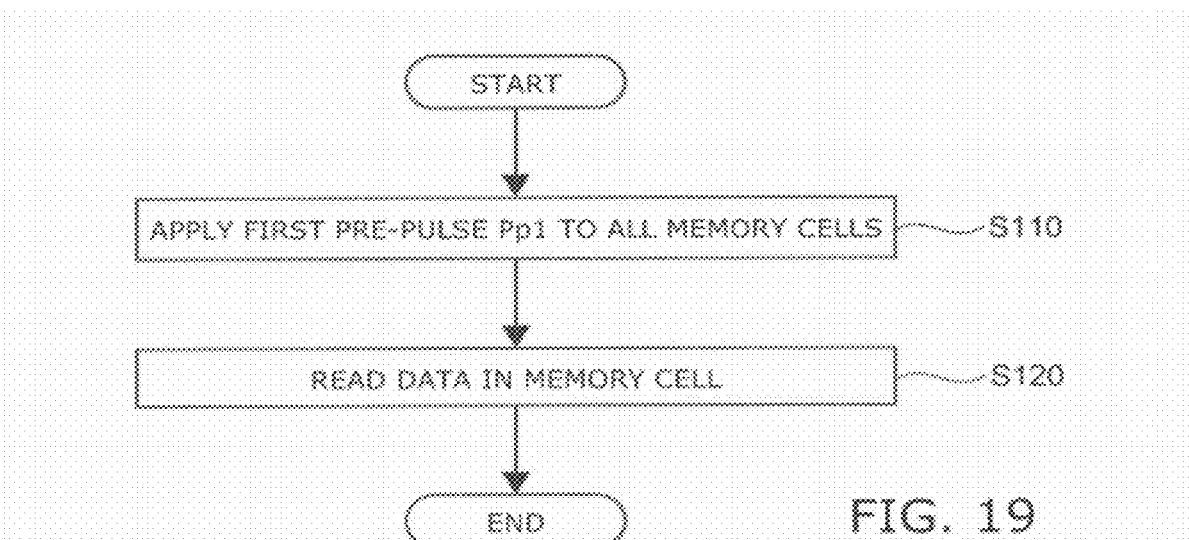
FIG. 19 is a flow chart illustrating a method for driving a nonvolatile semiconductor memory device according to a fourth embodiment.

FIG. 19 is a flow chart illustrating the method for driving a nonvolatile semiconductor memory device according to the fourth embodiment.

As illustrated in FIG. 19, in the method for driving a nonvolatile semiconductor memory device according to this embodiment, the first pre-pulse Pp1 (a third signal) with the voltage Vp1, whose absolute value is smaller than the absolute value of the voltage Vs of the transmission pulse Ps, is first applied to the gate electrodes 4 of all the memory cells M included in the memory string MS at the same time (Step S110).

As already explained, the first pre-pulse Pp1 is not necessarily applied to all the memory cells M at the same time. It is sufficient that differences in the history of the memory cells M1 to Mn before the timing of the read operation are reduced by applying the first pre-pulse Pp1. It may be possible that the application timing, time duration, and voltage value of the first pre-pulse Pp1 are different depending on the memory cells M1 to Mn.

After that, the read pulse Pr is applied to at least one of the memory cells M in the memory string MS to read data stored in the memory cells M (Step S120).

It is possible to apply the method explained concerning the first embodiment to the operations in steps S110 and S120.

Thus, it is possible to provide a method for driving a nonvolatile semiconductor memory device that can perform a stable read operation even though characteristic fluctuations are generated, which are caused by dielectric relaxation.

Fifth Embodiment

A fifth embodiment relates to a method for driving a nonvolatile semiconductor memory device, and more particularly to a driving method for the verify-program operation. Also in this case, for example, it is possible to apply the driving method to nonvolatile semiconductor memory devices having one of the configurations of the nonvolatile semiconductor memory devices 101 and 102, and preferably used in the case of using a high dielectric material in particular.

Figure 20:
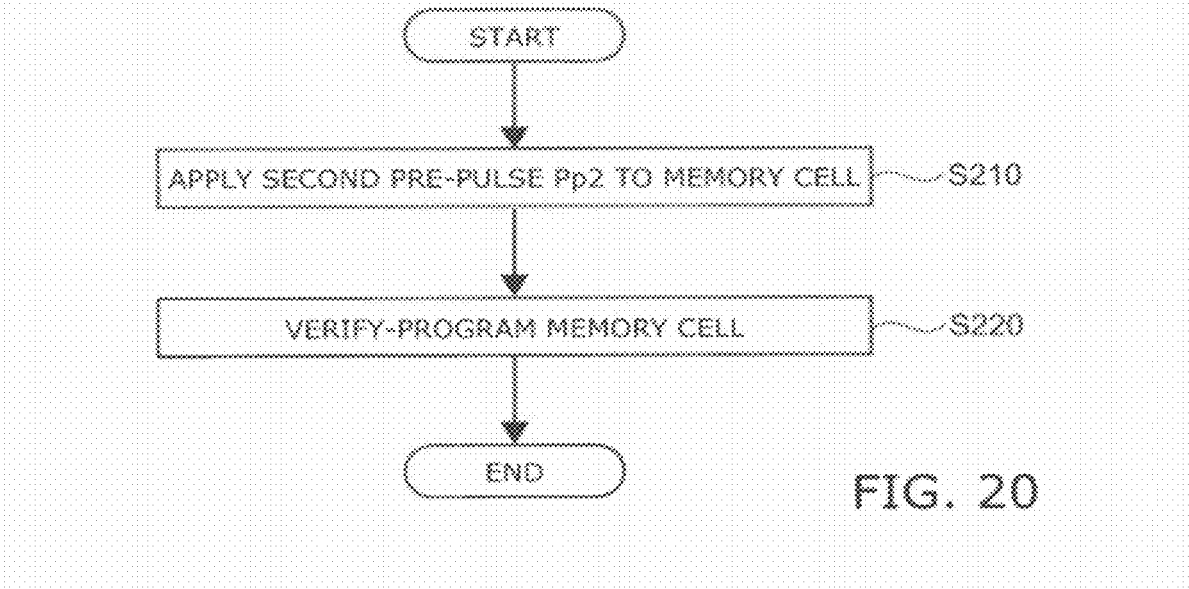
FIG. 20 is a flow chart illustrating a method for driving a nonvolatile semiconductor memory device according to a fifth embodiment.

FIG. 20 is a flow chart illustrating the method for driving a nonvolatile semiconductor memory device according to the fifth embodiment.

As illustrated in FIG. 20, in the method for driving a nonvolatile semiconductor memory device according to this embodiment, the second pre-pulse Pp2 (a seventh signal) is first applied to the gate electrode 4 of the memory cell M, to which data is programmed (Step S210).

After that, the program pulse Pw (a fifth signal) that programs data and the verify pulse Pv (a sixth signal) that verify-reads the programmed data are applied to the memory cell M (third cell), to which data is programmed, for programming data to the memory cell M (Step S220).

The aforementioned second pre-pulse Pp2 has the voltage Vp2 whose absolute value is smaller than the absolute value of the voltage Vw of the program pulse Pw.

It is possible to apply the method explained concerning the second embodiment to the operations in steps S210 and S220.

Thus, it is possible to provide a method for driving a nonvolatile semiconductor memory device that can perform a stable verify-read operation even though characteristic fluctuations are generated, which are caused by dielectric relaxation.

It is also possible to combine the fourth and fifth embodiments. In this case, it is possible to match the threshold read in the fourth embodiment with the threshold read in the fifth embodiment by one of the first method and the second method described concerning the third embodiment.

More specifically, the threshold of the memory cell M read by the read pulse Pr and the threshold of the memory cell M read by the verify pulse Pv are treated as the same program state.

It is possible to apply the nonvolatile semiconductor memory devices according to the foregoing first to third embodiments and the driving methods according to the fourth and fifth embodiments to the configurations of memory cell arrays in various forms. It is possible to apply the devices and methods to the configurations of memory cell arrays such as NAND, NOR, AND, DINOR, stacked, three-layer polysilicon and 3Tr-NAND memory devices, for example.

Hereinabove, the exemplary embodiments of the invention are described with reference to specific examples. However, the invention is not limited to these specific examples. The specific configurations of individual components such as the semiconductor layer, channel, source region, drain region, insulating film, charge retention layer, gate electrode, and various wires, for example, which constitute the nonvolatile semiconductor memory device and driving method for the same, are included in the scope of the invention, as long as one skilled in the art may appropriately select them from publicly known ranges, and similarly implement the invention to obtain the similar effect.

Further, any two or more components of the specific examples, which are combined within the extent of technical feasibility, are also included in the scope of the invention as long as they embody the teachings of the invention.

In addition to this, all of nonvolatile semiconductor memory devices and driving methods for the same, which one skilled in the art can obtain by properly modifying the design based on the nonvolatile semiconductor memory device and the driving method for the same described as the embodiments of the invention, are included in the scope of the invention, as long as they embody the teachings of the invention.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A nonvolatile semiconductor memory device comprising:
    a memory string having a plurality of memory cells; and
    a driving unit connected to the memory cells,
    each memory cell including:
        a semiconductor layer having a source region, a drain region and a channel provided between the source region and the drain region;
        a first insulating film provided on the channel;
        a charge retention layer provided on the first insulating film; and
        a gate electrode provided on the charge retention layer,
    in sequentially reading data stored in the memory cells by sequentially applying a first signal to each memory cell, a second signal being applied to a second cell when applying the first signal to a first cell the first cell being one of the memory cells, the second cell being the memory cell of the memory cells except the first cell,
    the driving unit being configured to apply a third signal to the gate electrodes of all the memory cells included in the memory string prior to the sequential reading,
    the third signal having a third signal voltage and a third signal time duration, an absolute value of the third signal voltage being smaller than an absolute value of a voltage of the second signal, the third signal time duration being equal to or more than a sum of time duration during which the first signal is sequentially applied to all the memory cells included in the memory string in the sequential reading,
    in a period prior to the application of the third signal, the driving unit configured to perform at least one of:
        applying a fourth signal to the gate electrodes of all the memory cells included in the memory string, and
        matching a potential of the gate electrodes of all the memory cells included in the memory string with a potential of the semiconductor layer.

2. The device according to claim 1, wherein each memory cell further includes a second insulating film provided between the charge retention layer and the gate electrode.

3. The device according to claim 2, wherein at least one of the first insulating film, the second insulating film, and the charge retention layer includes at least one of:
    one of layers selected from the group consisting of aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate; and
    a stacked layer made of two or more selected from the group.

4. The device according to claim 1, wherein an absolute value of a voltage of the fourth signal is smaller than a value that an electric field to be applied to the first insulating film by the fourth signal is 10 megavolts/centimeter.

5. The device according to claim 4, wherein a time duration of the fourth signal is 10 milliseconds or more.

6. The device according to claim 1, wherein the time duration of the third signal is 1 millisecond or more.

7. A method for driving a nonvolatile semiconductor memory device including: a memory string having a plurality of memory cells; and a driving unit connected to the memory cells, each memory cell including: a semiconductor layer having a source region, a drain region and a channel provided between the source region and the drain region; a first insulating film provided on the channel; a charge retention layer provided on the first insulating film; and a gate electrode provided on the charge retention layer, in sequentially reading data stored in the memory cells by sequentially applying a first signal to each memory cell, a second signal being applied to a second cell when applying the first signal to a first cell, the first cell being one of the memory cells, the second cell being the memory cell of the memory cells except the first cell, the method comprising:

prior to the sequential reading,
applying a third signal to the gate electrodes of all the memory cells included in the memory string; and
in a period prior to the application of the third signal, performing at least one of:
applying a fourth signal to the gate electrodes of all the memory cells included in the memory string; and
matching a potential of the gate electrodes of all the memory cells included in the memory string with a potential of the semiconductor layer,
the third signal having a third signal voltage and a third signal time duration, an absolute value of the third signal voltage being smaller than an absolute value of a voltage of the second signal and the third signal time duration being equal to or more than a time duration during which the first signal is applied to all the memory cells included in the memory string in sequential reading.

8. The method according to claim 7, wherein an absolute value of a voltage of the fourth signal is smaller than a value that an electric field to be applied to the first insulating film by the fourth signal is 10 megavolts/centimeter, and
a time duration of the fourth signal is 10 milliseconds or more.

9. The method according to claim 7, wherein the first insulating film includes at least one of:
one of layers selected from the group consisting of aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate; and
a stacked layer made of two or more selected from the group.

* * * * *